(12) United States Patent
Shibata et al.

(10) Patent No.: US 6,270,569 B1
(45) Date of Patent: Aug. 7, 2001

(54) METHOD OF FABRICATING NITRIDE CRYSTAL, MIXTURE, LIQUID PHASE GROWTH METHOD, NITRIDE CRYSTAL, NITRIDE CRYSTAL POWDERS, AND VAPOR PHASE GROWTH METHOD

(75) Inventors: Masatomo Shibata; Takashi Furuya, both of Tsuchiura (JP)

(73) Assignee: Hitachi Cable Ltd., Tokyo (JP)

( * ) Notice: Subject to any disclaimer, the term of this patent is extended or adjusted under 35 U.S.C. 154(b) by 0 days.

(21) Appl. No.: 09/096,458

(22) Filed: Jun. 11, 1998

Related U.S. Application Data

(63) Continuation-in-part of application No. 09/092,020, filed on Jun. 5, 1998.

(30) Foreign Application Priority Data

| Jun. 11, 1997 | (JP) | ..................................... 9-153755 |
| Aug. 18, 1997 | (JP) | ..................................... 9-221628 |
| Oct. 24, 1997 | (JP) | ..................................... 9-292561 |

(51) Int. Cl.$^7$ ............................. C30B 11/04; C30B 11/06

(52) U.S. Cl. ............................. 117/68; 117/73; 117/74; 117/75; 117/77; 117/78; 117/952

(58) Field of Search ............................. 117/952, 67, 78, 117/73, 74, 75, 77

(56) References Cited

U.S. PATENT DOCUMENTS

| 4,875,967 | 10/1989 | Mishima et al. . |
| 5,637,531 | * 6/1997 | Porowski et al. ..................... 117/89 |
| 5,868,837 | * 2/1999 | DiSalvo et al. ..................... 117/952 |

FOREIGN PATENT DOCUMENTS

| 56-051160 | * 12/1981 | (JP) ..................................... 117/952 |
| 10-007496 | * 1/1998 | (JP) ..................................... 117/952 |

OTHER PUBLICATIONS

Grzegory et al., "Recent results in the crystal grwoth of GaN at high N pressure", Journal nitride Semiconductor Research vol. 1 (20) pp. 1–6 1996.*

Elwell et al., "Crystal growth of GaN by the reaction between gallium and ammonia" Journal of Crystal Growth vol. 66 pp. 45–54, Jan 1984.*

Porowski et al., "Prospects for high–pressure crystal growth of III–V nitrides", Inst. Phys. Conf. Ser. No. 137: Chapter 4(1993).

(List continued on next page.)

Primary Examiner—Robert Kunemund
(74) Attorney, Agent, or Firm—Antonelli, Terry, Stout & Kraus, LLP

(57) ABSTRACT

A Group III metal element is heated so as to melt, a gas $NH_3$ containing nitrogen atoms is injected into a melt 3 of the Group III metal element at a temperature lower than the melting point of a nitride to be obtained, thereby producing a nitride microcrystal of the Group III element having high wettability with the melt 3 in the melt 3 of the Group III metal element. A mixture of the Group III nitride microcrystal obtained as mentioned above and the Group III metal element solution is used as a starting material of a liquid phase growth or Group III nitride powders obtained by removing the Group III metal material from the mixture are used as a starting material of a vapor phase growth. Further, a seed crystal or a substrate crystal is immersed in a melt of a Group III element such as gallium, bubbles of a gas containing nitrogen such as ammonia are intermittently come into contact with the surface of the crystal, and the Group III element and the gas containing nitrogen are allowed to react with each other on the surface of the seed crystal or the substrate crystal, thereby allowing the nitride crystal of the Group III element to be grown on the surface of the seed crystal or substrate crystal.

36 Claims, 12 Drawing Sheets

OTHER PUBLICATIONS

Nakamura et al., "Novel metal organic chemical vapor deposition system for GaN growth", *Appl. Phys. Letter.* 58(18)6, 1991.

Shibata et al., "Mass Synthesis of InP polycrystal by the P–injection method", The 34th Applied Physics Related Association Conference (1987) 28p–Z–1.

The Business and Technology Daily News, Technology Daily News Co., Ltd., Japan, Jan.21, 1997.

Li et al., "Synthesis of ultrafine gallium nitride powder by the direct current arc plasma method", *Appl. Phys. Letter.*, 69(9), Aug. 26, 1996, pp. 179–181.

Argoita et al., "Low pressure synthesis of bulk, polycrystalline gallium nitride", *Appl. Phys. Letter.* 70(2), Jan. 13, 1997, pp. 179–181.

McDonald, Jo Ann, U.S. correspondent, *III–Vs Review*, vol. 10, No. 3, 1997.

Derwent Abstract 85–194408 for JP600122797A (Toshiba), (7–85).

Derwent Abstract 82–91228E for JP570149899A (Kagaku Gijutsu–Cho Kinz), (9–82).

* cited by examiner

NH₃ →

↘ 27

TO EXHAUST GAS
TREATMENT EQUIPMENT

METHOD OF FABRICATING NITRIDE CRYSTAL, MIXTURE, LIQUID PHASE GROWTH METHOD, NITRIDE CRYSTAL, NITRIDE CRYSTAL POWDERS, AND VAPOR PHASE GROWTH METHOD

This application is a continuation-in-part application of application Ser. No. 09/092,020 filed Jun. 5, 1998, in the name of Masatomo SHIBATA and Takashi FURUYA, and, to the extent that said application Ser. No. 09/092,020 is not inconsistent with the present application, the contents thereof are incorporated herein by reference in their entirety.

BACKGROUND OF THE INVENTION

The present invention relates to a method of fabricating a nitride crystal of a Group III element, such as GaN, AlN, InN, or the like, a mixture, a liquid phase growth method, a nitride crystal, nitride crystal powders, and a vapor phase growth method.

A method of easily fabricating a Group III nitride bulk crystal of GaN, AlN, InN or the like has never existed. If a GaN bulk crystal can be made, its impact is beyond imagination for realization of a blue laser diode and the like. A bulk crystal of a wide band gap semiconductor material will be fully used in the 21st century.

As a method of fabricating GaN crystal powders, a method using the reaction of a Ga oxide, such as $Ga_2O_3$, with ammonia has been put into practical use. Powders fabricated by the method are available on the market as a reagent.

A method of easily fabricating a Group III nitride bulk crystal has not been developed. Although the following literature by S. Porowski et al. is published, since it calls for a very high pressure, it is dangerous and difficult to fabricate the crystal using this method. In addition, the size of the obtained crystal is as small as about a few mm.

"Prospects for high-pressure crystal growth of III–V nitrides" by S. Porowski, J. Jun, P. Perlin, I. Grzegory, H. Teisseyre and T. Suski, Inst. Phys. Conf. Ser. No. 137: Chapter 4.

Paper presented at the 5th SiC and Related Materials Conf., Washington, D.C., 1993.

A Group III nitride represented by GaN has a very high melting point and is decomposed and sublimated at a temperature lower than the melting point. Consequently, its melt cannot be produced and a crystal cannot be grown from the melt. Since the solubility of the Group III nitride to produce a Group III solution is very low, it is also difficult to grow a crystal from the solution, only three methods of growing a crystal of a Group III nitride have been put into practical use, and they are vapor phase epitaxial growth methods of HVPE (Hydride Vapor Phase Epitaxial growth), MOVPE (Metal Organic Vapor Phase Epitaxial growth), and MBE (Molecular Beam Epitaxial growth). LEDs made of a GaN manufactured by using such methods are available on the market. As an example of the GaN crystal growth by MOVPE, the following literature was published.

"Novel metal organic chemical vapor deposition system for GaN growth", S. Nakamura, Y. Harada and M. Seno, Appl. Phys. Lett. 58(18)6, 1991.

In recent years, attention has been given to the use of a nitride crystal of a Group III element represented by GaN as a material for a blue light emitting device. In order to produce the device, for example, it is necessary to epitaxially grow a GaN crystal on a substrate. In the epitaxial growth, it is ideal when the lattice constant and the coefficient of thermal expansion of the crystal as a substrate and those of a crystal which is grown on the substrate are the same in order to prevent occurrence of distortion in the crystal to be grown. However, a bulk crystal of a nitride which can be used as a substrate has not been obtained. A sapphire substrate or the like having a different lattice constant has to be used instead, and then a crystal is epitaxially grown on the sapphire substrate.

Although the MOVPE method is mainly used as an epitaxial growth method at present, there are problems in that an organic metal as such a material catches fire easily and is dangerous, and is expensive, and needs a large-scaled complicated expensive growth system. Hydrogen is inevitably contained as an impurity in the grown crystal and it is consequently difficult to increase the concentration of carriers of a p-type crystal.

In order to increase the carrier concentration of the p-type crystal, it is therefore necessary to arrange a p-type dielectric layer on the surface of a device and to perform a nitride crystal process. Since it is necessary to arrange the p-type dielectric layer on the surface of a device, the degree of freedom in designing the device structure is low.

Another epitaxial growth method is an LPE (Liquid Phase Epitaxial growth) method in which a Group III nitride crystal is dissolved as a solute in a melt of a Group III element and a liquid phase epitaxial layer is grown from the solution. The Group III nitride crystal conventionally sold on the market consists, however, of fine powders produced by reacting a Ga oxide, such as $Ga_2O_3$ in case of GaN, with ammonia. The surface of the GaN crystal is not easily wet due to the shape and there is consequently a problem that the powders are not easily dissolved in Ga.

Nitride crystal powders are expected to be applied as a luminescent material and a dopant material in liquid phase epitaxial growth of GaAs, GaP, and the like. The GaN crystal powders which are conventionally available on the market have a low impurity for the cost and are unsuitable as a starting material for vapor phase growth. Since the powders are not easily dissolved in a semiconductor solution due to the shape, there is a problem that the powders are not easily used as a material for liquid phase growth or a dopant material.

On the other hand, a method called hot pressing in which a substance as a material is charged into a cylinder and heated and molded while pressurizing it by a piston is generally used for molding ceramics and the like.

According to the hot pressing method, although a nitride such as AlN can be molded under pressure by using an appropriate binder, a single crystal growth has not been realized yet. This is because the melting point of a nitride crystal is very high and a nitride is decomposed before the temperature of the material reaches the melting point and nitrogen escapes from the material.

SUMMARY OF THE INVENTION

It is an object of the invention to provide a novel method of fabricating a nitride crystal, a mixture, a vapor phase growth method, a nitride crystal, nitride crystal powders, and a vapor phase growth method which can solve the foregoing drawbacks of the conventional techniques and make it possible to easily and cheaply obtain a nitride crystal of a Group III element having a high impurity such as GaN.

It is another object of the invention to provide a novel crystal growing method which can easily and safely grow a bulk crystal of a nitride crystal of a Group III element, such as GaN, which has not been obtained heretofore, and a novel crystal growing method which can make it possible to easily and safely epitaxially grow a Group III nitride crystal.

The first aspect of the invention is based, broadly, on the following three points.

(1) A reaction is made by injecting a gas containing nitrogen, such as ammonia, into a melt of a Group III element, such as Ga. Consequently, a large amount of microcrystals of the Group III nitride are floated to the surface of the melt of the Group III element.

(2) A mixture of the Group III element and the Group III nitride microcrystals which is obtained in this manner is used as a material and a liquid phase epitaxial growth of the Group III nitride crystal is performed. The Group III element nitride microcrystal obtained by the above method is easily wet by the Group III element solution, so that the Group III element microcrystals can be easily dissolved in the Group III element melt.

(3) The Group III nitride microcrystal obtained by removing the Group III element from the mixture by acid cleaning or the like is used as a material to grow the vapor phase of a Group III nitride crystal or to produce a molten or sintered crystal. The material obtained by this method has a high impurity and is cheap.

Specifically, a method of injecting a vapor of a Group V element into a Group III melt to synthesize a Group III–V compound is called an injection method and is a known technique. For example, as an example of synthesizing a polycrystal of InP as one of the Group III–V compound semiconductors, there is an academic report as shown below.

"Mass synthesis of InP polycrystal by the P-injection method", Shibata et. al, the 34th Japanese applied physics related association conference (1987) 28p-Z-1.

The injection method is, however, a so-called melt growth method in which the Group III melt is heated to a temperature equal to or higher than the melting point of the Group III–V compound as a synthesis, the vapor of a Group V element is first injected to produce a melt of the Group III–V compound, and the melt is cooled to thereby produce a crystal. On the contrary, a nitride synthesizing method according to the invention is quite different from the conventional injection method in that a gas containing nitrogen is injected into a Group III melt at a temperature much lower than the melting point of the nitride to be obtained by the synthesis, the liquid-phase Group III element and the vapor-phase Group V element are reacted, and a solid-phase Group III nitride microcrystal is directly formed in the Group III element solution (it cannot be produced in the melt of the nitride). The characteristic that the solubility of a nitride to the Group III element melt is very low is positively used.

In the nitride crystal fabricating method according to the invention, by mixing an impurity element with the Group III metal element, a Group III nitride crystal in which an impurity is doped can be fabricated. By using the nitride crystal fabricating method according to these features, a mixture of the Group III nitride powders and the Group III metal material can be obtained.

A mixture of the Group III nitride crystal and the Group III metal material according to the invention is especially characterized in that, although the Group III nitride crystal is a microcrystal, the surface is completely wet by the Group III metal element. When crystal fine powders are added to a material for liquid phase growth or a dopant, the fine powder having a surface area which is large for the volume is not easily wet by the Group III melt, so that there is a problem that the fine powders are not easily dissolved. Especially, in a nitride crystal having a low saturation solubility, the low solubility is a critical drawback for crystal growth. The Group III nitrides which are conventionally available on the market are in almost fine powder states and unconditionally have the foregoing drawback.

In the conventional Group III nitride synthesizing method, since a Group III oxide or chloride is used as a material, a process for removing a nonreacted material from the synthesized nitride powders is always necessary. Since an oxide or chloride is not used as a material in the fabricating methods according to the invention, an unreacted material does not become an impurity at the time of liquid phase growth. When the oxide or chloride is not used as a material for liquid phase growth, the mixture can be therefore directly used as a material for liquid phase growth without extracting only the group III nitride. If the extracting process can be omitted, not only can the process be largely shortened, but also contamination of the material which tends to occur in the extracting process can be prevented, so that a liquid phase growth with high impurity can be realized.

Although the invention relates to a liquid phase growth method, the invention can be also applied to a vapor phase growth method. That is, the invention relates to Group III nitride crystal powders obtained by removing the Group III metal material from the mixture and the Group III metal material obtained by the nitride crystal fabricating method.

The invention also relates to a method of fabricating a Group III nitride crystal which is obtained by melting and re-solidifying or sintering the Group III nitride powders and re-solidifying or sintering the melt.

The second point of the invention is a method of immersing a seed crystal or a substrate crystal into a melt of a Group III element, such as gallium, allowing bubbles of a gas containing nitrogen, such as ammonia, to intermittently come into contact with the surface of the crystal, and reacting the Group III element with the gas containing nitrogen on the surface of the seed crystal or the substrate crystal, thereby growing a Group III element nitride crystal on the surface of the crystal.

The nitride crystal growing method is also based on the condition that the gas containing nitrogen is injected into the melt of a Group III element at a temperature much lower than the melting point of the nitride to be synthesized and the liquid-phase Group III element is reacted with the vapor-phase Group V element, thereby directly forming the solid-phase Group III nitride crystal in the Group III element melt (a melt of nitride cannot be produced in the melt of a nitride). The characteristic such that the solubility of a nitride to a Group III element melt is very low is positively used. The condition itself is a crystal growing method based on a novel concept which is quite different from the growing method using a melt, such as the above-mentioned injection method.

It is known that a Group III element, such as gallium, aluminum, indium, or the like, and a gas containing nitrogen, such as ammonia, hydrazine, or the like react with each other at a temperature of about a few hundreds to 1000° C. which is considerably lower than the melting point of a nitride (which is said to be 2000° C. or higher in the case of GaN) and a Group III nitride is formed. For example, there is a report as shown below.

"Crystal growth of GaN by reaction between Ga and $NH_3$" D. Elwell et. al., J. Crystal Growth 66 (1984) 45–54.

However, the GaN formed by such method is not dissolved in the Group III melt, but is covered over the surface of the Group III melt.

In a nitride crystal fabricating method according to the invention, a seed crystal or a substrate crystal is immersed in a melt of a Group III element, such as gallium, and bubbles of a gas containing nitrogen, such as ammonia, are intermittently brought into contact with the surface of the crystal. By the reaction between the Group III element and the gas containing nitrogen on the surface of the seed crystal or the substrate crystal, the Group III atoms connected to the surface of the seed crystal or the substrate crystal are nitrided and a nitride crystal can be epitaxially grown on the substrate. By continuously repeating the reaction, an epitaxial film or a bulk crystal can be grown.

In the nitride crystal fabricating method according to the invention, the Group III element is either Al, Ga, or In and ammonia gas can be also used as the gas containing the nitrogen atoms A nitride crystal growing method as a third point of the invention is characterized by including a process for charging nitride crystal powders and a liquid encapsulating material into a cylinder and for heating the materials while pressurizing it using a piston.

After producing a melt of a nitride by heating under pressure, the nitride melt can be solidified in a process for returning the pressure and the temperature to a normal pressure and temperature. It is also possible to heat the nitride crystal powders until just before a melting point of the nitride and to produce a solid-phase growth of the nitride crystal. The nitride crystal powders may be preliminarily molded under pressure. It is preferable when the starting material of a nitride is GaN crystal powders synthesized by the injection method. Preferably, the material powders are exposed in a vacuum or in a nitrogen atmosphere at least until the liquid encapsulating material melts. It is preferable when the nitride material in the cylinder has a temperature gradient. It is preferable to arrange the seed crystal on the low temperature side in the nitride material. It is preferable to repeat the temperature increase and decrease and/or pressure increase and decrease during the crystal growth. A component element of the nitride crystal can be used as a binder when the nitride crystal powders are molded under pressure.

A method of growing a Group III nitride crystal according to the invention for heating a flux and Group III nitride crystal powders under pressure to dissolve the Group III nitride crystal powders in the flux, and after that, cooling the solution, thereby growing a Group III nitride crystal, is characterized in that the heating temperature of the flux is 800° C. or higher and the flux contains at least one of Ga, In, Pb, Sn, Bi, and Na.

Preferably, the flux and the Group III nitride crystal powders as materials are a mixture of the Group III element and the Group III nitride crystal powders obtained by the injection method. The flux in which the Group III nitride as a material is dissolved has a temperature gradient. By cooling the solution, the Group III nitride crystal can be deposited on the low temperature side. The seed crystal is arranged in the flux and the Group III nitride crystal can be deposited on the seed crystal. It is preferable to float a liquid encapsulating agent on the flux. A cylinder and a piston can be used as pressurizing means.

A method of growing a Group III nitride crystal according to another embodiment of the invention will be described.

(1) The point of the embodiment is that, when a nitride as a material is heated and pressurized, a liquid encapsulating material is used in order to prevent decomposition or sublimation of the nitride.

As a modification of the hot pressing, HIP (hot isotropic pressing) is known. HIP is a method of performing hot pressing by using an appropriate medium in order to uniformly apply pressure to a sample. Another powders which do not react with the gas or the sample are generally used as a medium in HIP since the property of release from the sample is regarded as important. The medium is not effective for suppressing the decomposition or sublimation of the material. This is the point which is different from the present invention using the liquid encapsulating agent. On the other hand, since the liquid encapsulating agent in the embodiment also acts as a medium, the nitride material can be isotropically pressurized, and, consequently uniform crystals can be grown.

As a starting material of the nitride, the GaN crystal powders fabricated by the injection method of the invention also can be used. The powders fabricated by the method have a high impurity and a fine grain size and are regular in size. Consequently, pressure can be easily applied isotropically in a pressurizing operation, so that a uniform crystal having a high impurity can be grown. Since a large amount of GaN powders can be easily obtained at a low cost in the injection method, it is also effective to reduce the manufacturing cost of the GaN single crystal.

As a binder, a construction element of the nitride crystal can be used. For example, in the case of GaN crystal growth, it is preferable to add and mix a small amount of a metal Ga to GaN powders and to grow a crystal by using the mixture as a starting material. This is a means for holding the impurity of the grown crystal. From this point of view, it is desirable not to use a substance containing a component which becomes an impurity as a binder.

It is preferable to expose the material powders in a vacuum until the liquid encapsulating material melts in order to remove a gas existing in the powder particles of the material so that bubbles are not formed in the grown crystal and the liquid encapsulating agent. It is also preferable to put the material powders in nitrogen in order to introduce nitrogen gas into the powders of the material. The nitrogen gas is dissolved in the material solution so that a nitride is synthesized as much as possible.

It is preferable when the material has a temperature gradient so that the crystal growing direction is limited to one direction from the low temperature side to the high temperature side to grow a bulk uniform single crystal. A case of arranging the seed crystal on the low temperature side has a similar purpose.

It is preferable to set the height of the material larger than the diameter, so that the temperature gradient of the material during the crystal growth becomes larger in the longitudinal direction than in the radial direction. Consequently, the crystal is easily grown in the above-mentioned one direction.

The pressure and the temperature can be repeatedly increased and decreased, so that the nucleus of the nitride crystal is deposited and re-dissolved, and a superior growth nucleus is selectively left, thereby growing a bulk nitride single crystal grain.

(2) The point of another embodiment of the invention is that powders of Group III nitride crystal itself are used as a material as a solute in a method using a flux, and the surface of each of the material powders is preliminarily covered by the flux so that the powders are not sublimated or decomposed.

The method of using the powders of the crystal to be grown as a material of the flux method seems obvious and is a flux method generally used for an oxide crystal growth. In the Group III nitride crystal growth, however, the flux method in which a Group III nitride crystal itself is used as a material has never been reported. As the reasons, it can be mentioned that, first, the fabrication itself of the Group III nitride crystal powders is difficult and it is difficult to acquire the material; and, second, the powder material has a low density and is easily floated on the flux, and the surface of the material is not easily wet by the flux and consequently is not easily dissolved in the flux. Although it can be considered that the powders are dissolved easier if the grain size of the material powder is enlarged, a method of easily acquiring the Group III nitride crystal having a large grain size has not been reported under the present conditions.

However, by the method of the subject invention, the Group III nitride crystal powders can be easily produced, so that the first problem is solved. Further, if when the mixture of a Group III nitride microcrystal and a Group III metal material according to the invention is used, the second problem also can be solved.

Further, as a result of examinations, it was found that even when GaN powders fabricated by a method other than the injection method, for example, a method of reacting gallium chloride with ammonia gas at a high temperature, are used, if the GaN powders are mixed well with Ga, which is preliminarily melt, and the surface of each of the GaN powders is covered by the flux, sublimation and decomposition can be suppressed to a degree which is ignorable. The effect was also recognized not only in the case of using Ga as a flux, but also in the case where a flux including at least one of In, Pb, Sn, Bi, and Na is used.

The reason why GaN is grown at a temperature equal to or higher than 800° C. in the embodiment is because the mode of the crystal growth of GaN is changed after 800° C.

That is, the higher the temperature of the flux is, the more GaN is dissolved in the flux. Consequently, in order to efficiently grow the crystal, it is preferable for the growth temperature to be higher. Since the solubility of GaN to the flux is continuously changed with temperature, it does not mean that the solution quantity is changed after 800° C. However, it was found that when the GaN crystal is grown at a temperature lower than 800° C., the dissolved GaN is again deposited only on the surface of each of the undissolved GaN powders and a bulk crystal cannot be grown even if the pressure and the cooling time are changed.

On the other hand, it was found that, at a temperature equal to or higher than 800° C., although a deposition is seen on an undissolved powder, a new crystal nuclei is grown in a low temperature part of the flux. As a result, it leads to the method of growing a bulk GaN single crystal.

Although it is difficult to grow a bulk crystal in a low temperature around 800° C., if the flux has a temperature gradient and a crystal is grown by a method using a temperature difference, it is not impossible It is necessary to perform a wetting of the surface of the GaN powder as a material by the flux at a temperature lower than 800° C. since the sublimation or decomposition of GaN starts when the temperature exceeds 800° C. The melting point of a material used as a flux therefore has to be lower than 800° C.

As a material used as a flux, in addition to the condition that the melting point is lower than 800° C., it is necessary to choose a material into which GaN can be dissolved and which does not form another compound by a reaction with GaN. For example, in case of growing a GaN crystal, aluminum or the like satisfies the former condition, but forms AlN by the reaction with GaN, so that it cannot be used as a flux. As a flux for growing a GaN crystal, the flux has to be stable without being decomposed at a temperature high enough to dissolve GaN.

As a flux, a material obtained by mixing Bi with Ga can be used. The material has an advantage that the frequency of occurrence of deposited nuclei is suppressed at the time of the GaN crystal growth and the yield of the single crystal is improved.

In order to suppress elimination of GaN from the flux and evaporation of the flux itself, it is preferable to pressurize after the surface of the flux is covered by a liquid encapsulating agent. As the pressurization gas in this case, any kind of gas can be used as long as it has a property that it does not cause any inconvenience by producing a reaction with the liquid encapsulating agent or a component material of the apparatus. It is obviously understood that the material can be mechanically pressurized by a piston or the like.

DETAILED DESCRIPTION OF THE PREFERRED EMBODIMENTS

Embodiments of the invention will be described hereinbelow.

(Embodiment 1)

Figure 1:
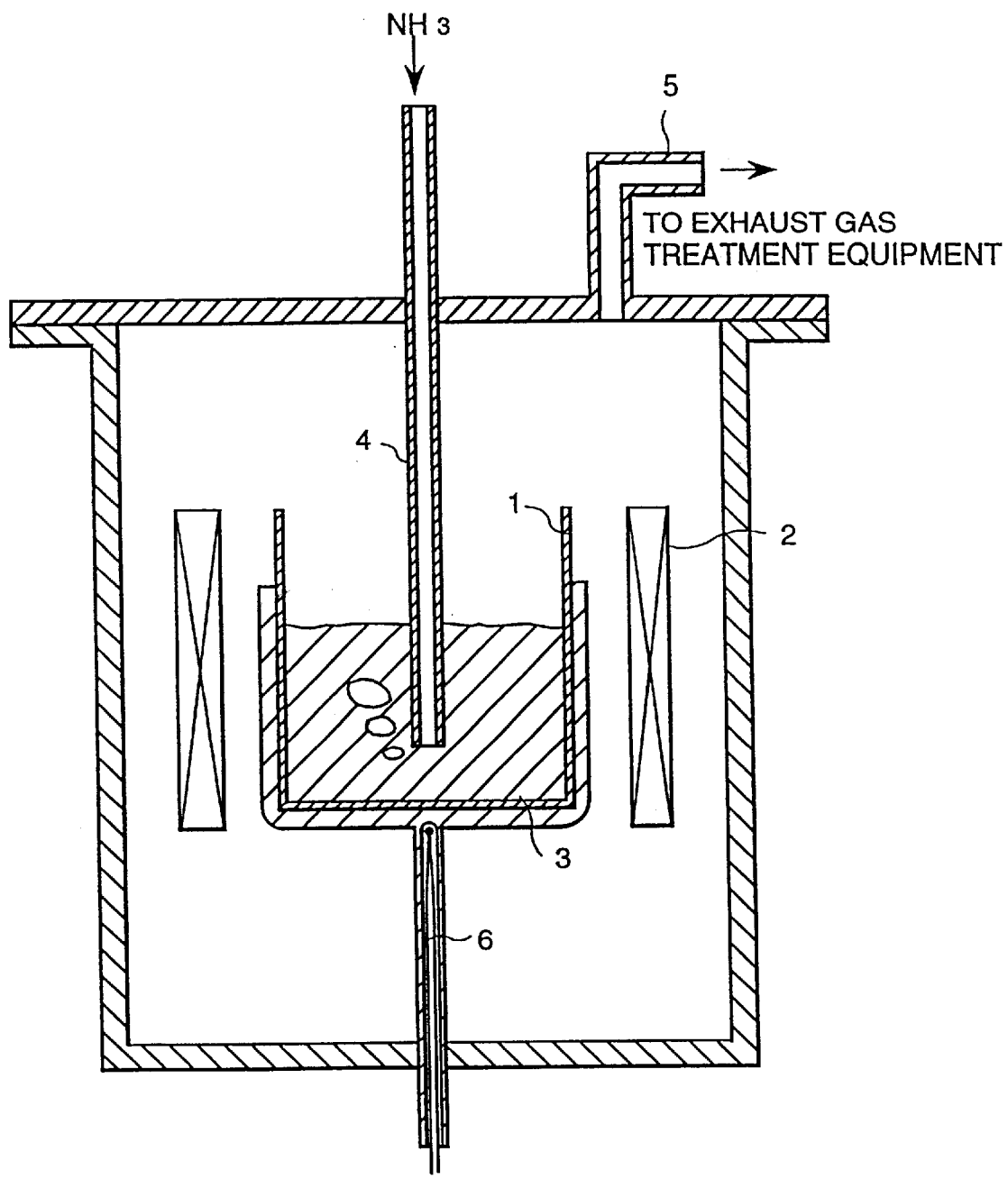
FIG. 1 is a schematic cross section of a GaN crystal synthesizing system used for first to seventh embodiments of the invention.

As an embodiment of the invention, an apparatus shown in FIG. 1 was produced. An example of a method of synthesizing a GaN microcrystal by using this apparatus will be described.

3000 g of Ga was charged in a quartz crucible 1 having an inner diameter of 70 mm and a height of 150 mm, and the Ga was heated to 950° C. by means of a heater 2, thereby obtaining a Ga melt 3. Ammonia gas was injected into the Ga melt 3 via a gas introduction pipe 4 at a flow of 0.5 l/min for five hours. The gas injected into the melt 3 reacted with the melt to thereby form GaN microcrystals. The GaN microcrystals floated to the surface of the Ga melt. Ammonia gas which did not contribute to the reaction was released as bubbles, which passed through the melt 3, escaped to the space in the upper part of the vessel, and were exhausted to the outside of the vessel via an exhaust pipe 5. The exhausted ammonia gas was discharged to the atmosphere via wet type exhaust gas treatment equipment. After the gas injection for five hours, the gas being injected was changed to nitrogen and the Ga melt was cooled to room temperature.

The cooled Ga melt was taken out from the vessel and observed. A large amount of GaN microcrystals had floated on the Ga melt. The surface of the GaN microcrystal was completely wet by the Ga melt. An increase in the weight of the Ga melt of 10.2 g was recognized after the synthesis work as compared with the Ga melt before the work. According to calculation based on the weight increase, 61 g of GaN microcrystals was synthesized.

(Embodiment 2)

Figure 2:
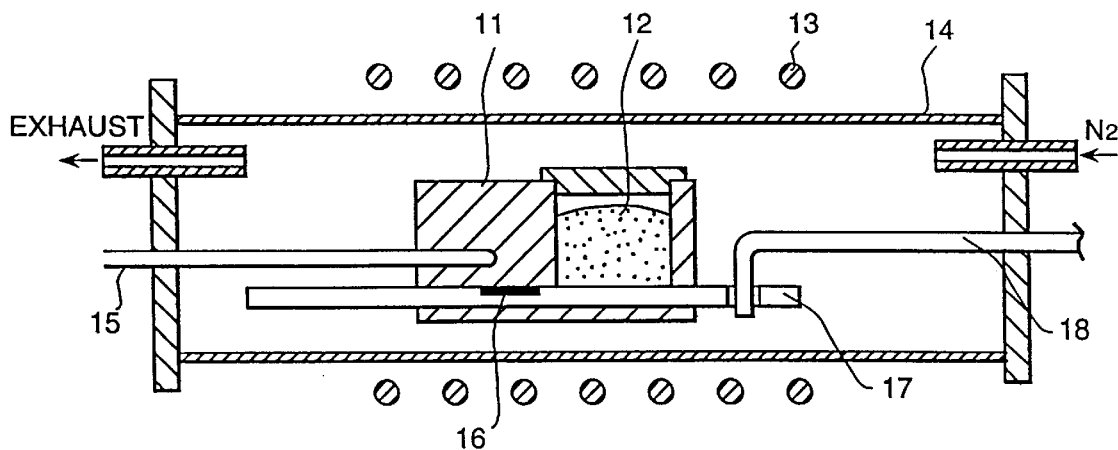
FIG. 2 is a schematic cross section of a liquid phase growth system for a GaN crystal according to a second embodiment of the invention.
Figure 3:
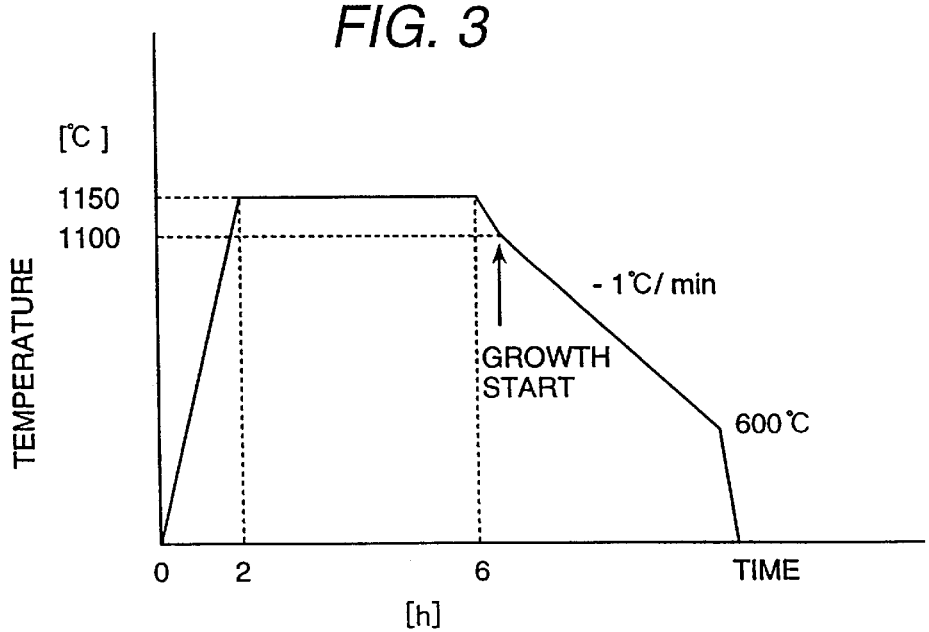
FIG. 3 is a graph showing a temperature program when a liquid phase of the GaN crystal according to the second embodiment of the invention is grown.

The GaN microcrystal was synthesized in a manner similar to the first embodiment, a mixture of the Ga melt and the Ga microcrystal which floated on the Ga melt was used as a material, and liquid phase epitaxial growth of GaN was performed by a slide boat method. FIG. 2 is a schematic cross section of an apparatus used for the growth. FIG. 3 shows a temperature program at the time of the liquid phase epitaxial growth. 20 g of the mixture of the Ga melt and the GaN microcrystal as a material 12 was put in a graphite boat 11. On a slide boat 17, a c-face sapphire substrate 16 of (25×25 mm) was set. A quartz reaction tube 14 had therein a nitrogen gas flow atmosphere and the material was heated by heaters 13 until an output of a thermocouple 15 became 1150° C. After the material was left for four hours in such a state, the temperature was lowered to 1100° C., the slide boat 17 was moved by pulling an operation rod 18 and the sapphire substrate 16 came in contact with the material 12. After that, the temperature of the material was lowered to 600° C. at a rate of 1° C. per minute, the operation rod 18 was pushed to return the slide boat 17 to the original position, and the substrate 16 and the material 12 were separated. The power source of the heater was turned off and the material 12 was cooled to room temperature.

Figure 4:
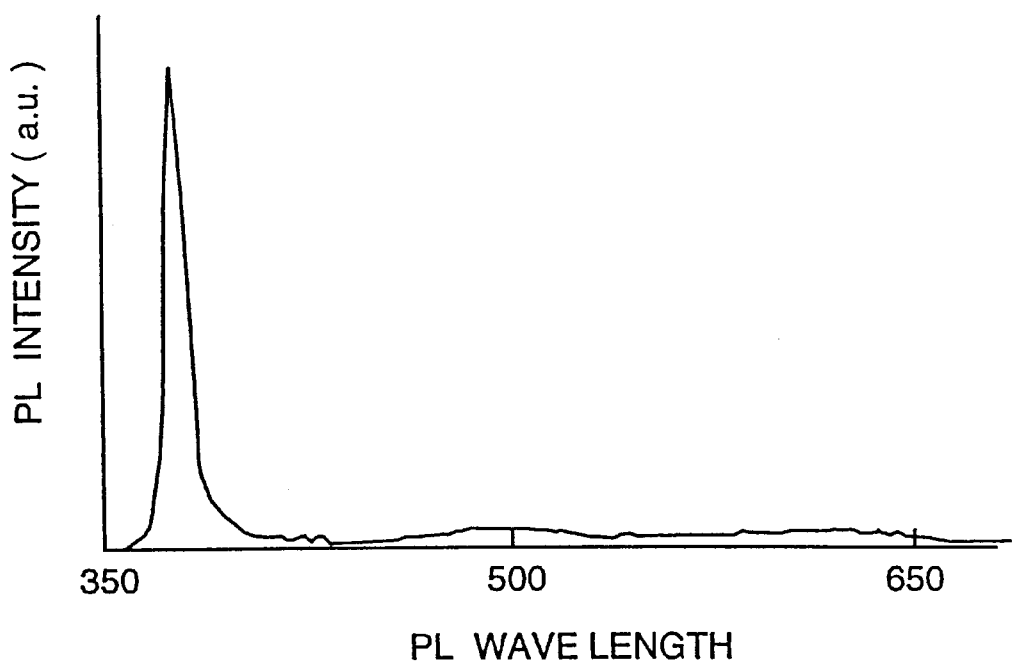
FIG. 4 is a diagram showing a photoluminescence measurement result at a room temperature of a liquid phase epitaxial growth undope GaN crystal film according to a second embodiment of the invention.

The substrate to which the growth was performed was taken out and the surface and the cross section were observed. A transparent film was grown on the sapphire substrate. The film thickness obtained by the SEM observation of the cross section was 4.2 μm. A photoluminescence measurement result of the grown film at room temperature is shown in FIG. 4. A sharp light emission peak of 360 nm corresponding to a band edge emission of GaN shown in FIG. 4 was observed and the grown film was confirmed to be a high-quality GaN film. The electric characteristics of the grown film were measured by the Van der Pauw method. Preferable characteristics such as a carrier concentration of $1 \times 10^{17}$ cm$^{-3}$ and a mobility of 520 cm$^2$/V·sec were shown.

(Embodiment 3)

In a manner similar to the first embodiment, 20 mg of Si was preliminarily added to the material Ga and the GaN microcrystal was synthesized, a mixture of the obtained Ga solution and GaN microcrystal was used as a material, and liquid phase epitaxial growth of GaN was performed by a slide boat method similar to that of the second embodiment.

Figure 5:
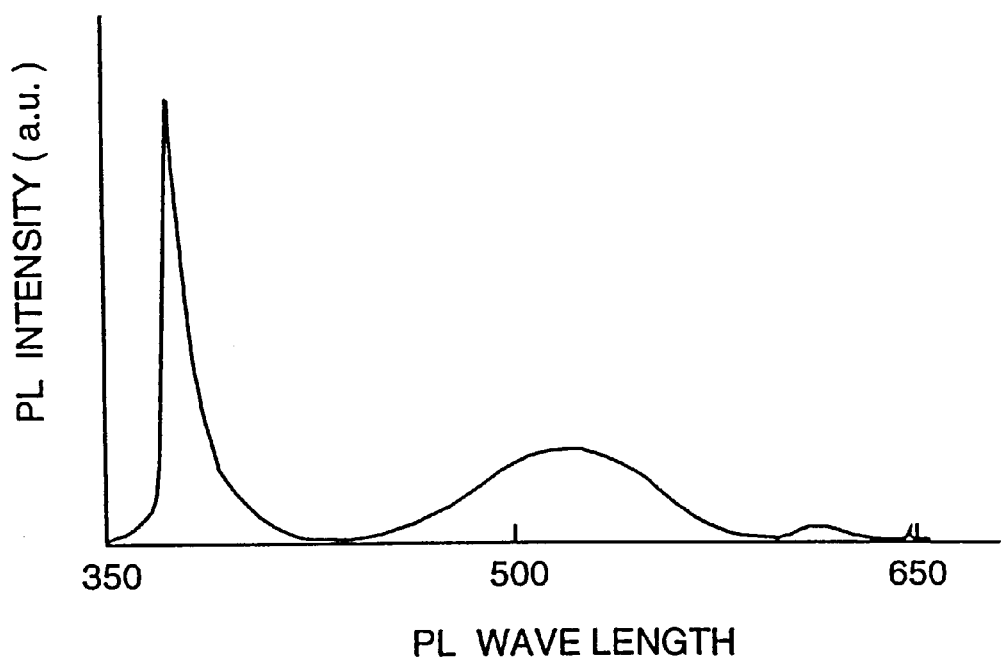
FIG. 5 is a diagram showing a photoluminescence measurement result at a room temperature of a liquid phase epitaxial growth Si doped GaN crystal film according to a third embodiment of the invention.

FIG. 5 shows a result of photoluminescence measurement of the obtained GaN film at room temperature. A sharp light emission peak of 369 nm corresponding to light emission of Si doped GaN was observed and it was confirmed that Si was doped on the grown film. The carrier concentration of the grown film was measured by the Van der Pauw method and was found to be $6 \times 10^{18}$ cm$^{-3}$ of the n-type.

(Embodiment 4)

In a manner similar to the first embodiment, 7 mg of Mg was preliminarily added to the material Ga and the GaN microcrystal was synthesized, a mixture of the obtained Ga solution and GaN microcrystal was used as a material, and liquid phase epitaxial growth of GaN was performed by a slide boat method similar to that of the second embodiment.

Figure 6:
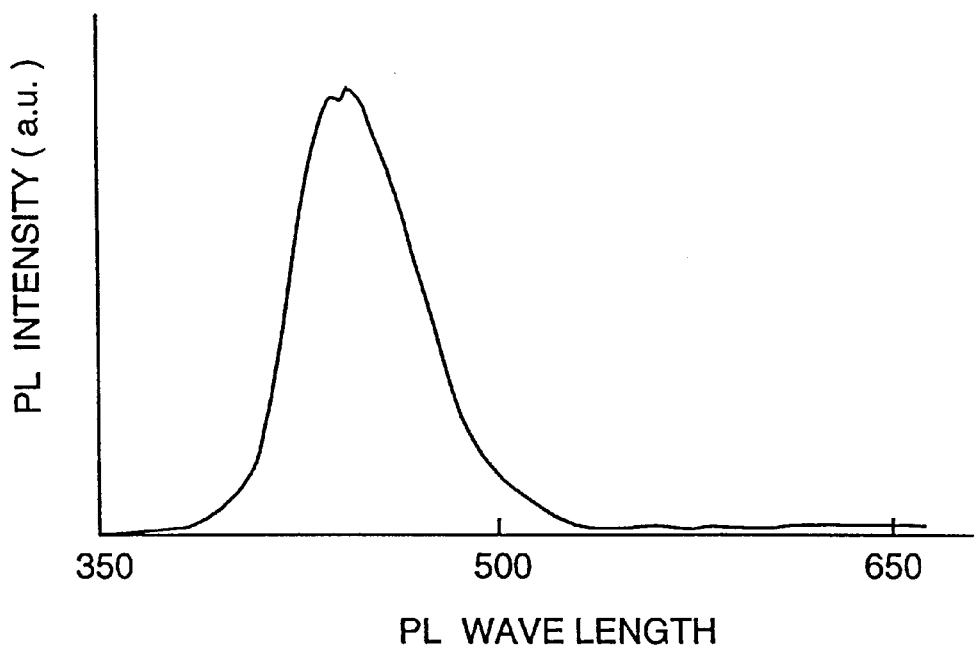
FIG. 6 is a diagram showing a photoluminescence measurement result at a room temperature of a liquid phase epitaxial growth Mg doped GaN crystal film according to a fourth embodiment of the invention.

FIG. 6 shows a result of photoluminescence measurement of the obtained GaN film at room temperature. A light emission peak of 445 nm corresponding to light emission of Mg doped GaN was observed and it was confirmed that Mg was doped in the grown film. The carrier concentration of the grown film was measured by the Van der Pauw method and was $5 \times 10^{17}$ cm$^{-3}$ of the p-type. According to the Mg doped GaN film obtained in this method, although the Mg in the crystal is not activated if heat treatment is not performed on the film obtained by the MOVPE growth and p-type electric characteristics are not shown, preferable p-type electric characteristics are shown in an as-grown state It can be considered that the hydrogen atoms which prevent the activation of Mg were not doped.

(Embodiment 5)

Figure 7:
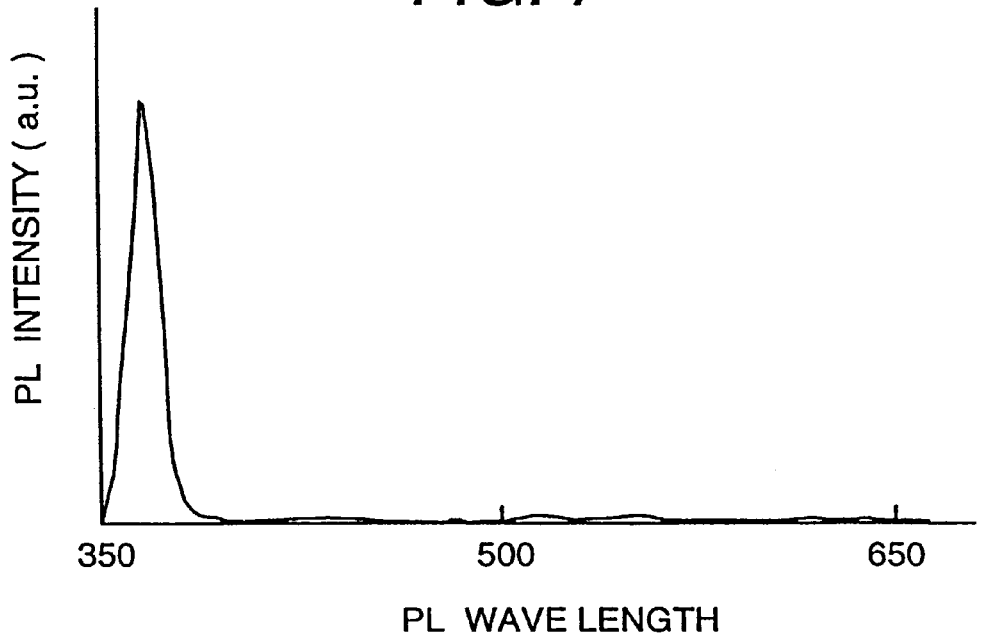
FIG. 7 is a diagram showing a photoluminescence measurement result at a room temperature of undoped GaN microcrystal powders according to a fifth embodiment of the invention.

A mixture of an undoped GaN microcrystal synthesized by a method similar to that of the first embodiment and a metal Ga was extracted, hydrochloric acid and hydrogen peroxide water were added to the mixture, and only Ga was dissolved, after that, only a GaN microcrystal was filtered by means of filter paper. The filtered powders were sufficiently cleaned by pure water and were dried in a vacuum high temperature vessel. Consequently, 61 g of white gray powders were obtained. When the powders were observed by a microscope, the powders were constructed by microcrystals each in basically a hexagonal column shape having a grain size of about 10 μm. The result of photoluminescence measurement, at room temperature, of the powder is shown in FIG. 7. A sharp light emission peak of 360 nm corresponding to GaN band edge emission was observed and it was confirmed that the obtained microcrystal is high-quality GaN. The concentration of impurities which can be contaminated in the obtained powders was checked by secondary ion mass spectroscopy (SIMS). Although about $5\times10^{15}$ cm$^{-3}$ of Si, which seems to be doped from the quartz container, was detected, others were below the detection limits.

(Embodiment 6)

Figure 8:
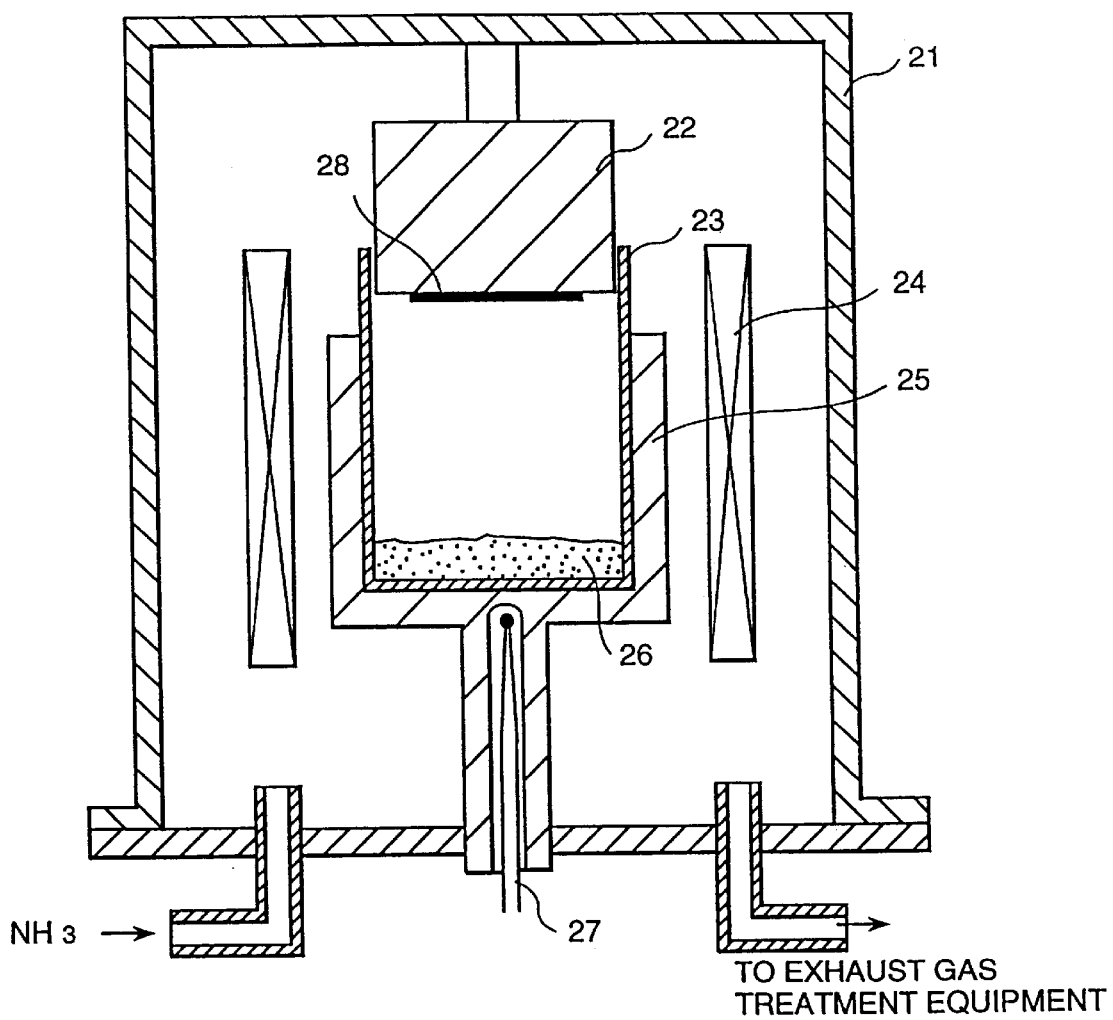
FIG. 8 is a schematic cross section of a vapor phase growth system of a GaN crystal according to a sixth embodiment of the invention.

The GaN microcrystal powders obtained in the fifth embodiment were used as a material and vapor epitaxial growth of GaN was performed by an apparatus as shown in FIG. 8. 25 g of GaN microcrystal powders 26 as a material were charged into a quartz crucible 23 having the diameter of 50 mm. The quartz crucible 23 was supported by a graphite susceptor 25 and was set in a quartz vessel 21. On the other hand, a c-face sapphire substrate 28 of (25 mm×25 mm) was fixed by a substrate holder 22 made of graphite and was suspended in the quartz crucible 23 so that the surface of the substrate faced the material 26. In such a state, the inside of the quartz vessel 21 was replaced by an ammonia gas atmosphere. While the ammonia gas flowed at 0.5 l/min, the material was heated by heater 24. The heating was controlled by an output of a thermocouple 27 arranged below the crucible so as to be 1100° C. In this instance, the surface temperature of the substrate 28 was about 850° C. The crystal was grown by sublimation by holding the material in a heated state for 24 hours.

A transparent GaN film was grown on the surface of the sapphire substrate which was taken out. When the surface of the GaN film was observed by a microscope, triangle to hexagonal morphologies were observed. The average thickness of the grown film was about 400 µm. When the electric characteristics of the grown film were measured by the Van der Pauw method, preferable characteristics in the form of a carrier concentration of $2\times10^{17}$ cm$^{-3}$ and a mobility of 490 cm$^2$/V·sec were shown.

(Embodiment 7)

In a manner similar to the first embodiment, InN was synthesized by using In instead of Ga. The same conditions as those of the first embodiment except for the synthesis temperature of 600° C. were used. Synthesized In was cooled to 180° C., and a mixture of InN microcrystals and the metal which floated on the In solution were taken out before the solidified.

After hydrochloric acid and hydrogen peroxide water were added and only In was dissolved, the solution was filtered by filter paper and only the InN microcrystals were taken out. The powders obtained by the filtering were sufficiently cleaned by pure water and dried in a vacuum high temperature vessel. As a result, about 200 g of light white gray powders were obtained. When the powders were observed by a microscope, the powders were found to be constructed by microcrystals each basically in a hexagonal column shape having a grain size of about 8 µm. When the photo luminespectral of the obtained powders was measured, light emission of 650 nm corresponding to a band edge emission of InN was observed.

(Modification)

Although GaN crystal growth has been mainly described, and also InN crystal growth has been mentioned in the foregoing embodiments, the invention can be also applied to crystal growth of AlN, and AlGaN, GaInN, and the like as mixed crystals of AlN or InN.

As a gas containing nitrogen, other than ammonia, it is possible to use hydrazine, mono methyl hydrazine, or the like.

Although a embodiment of the liquid-phase crystal growth under normal atmosphere has been described, when the crystal is grown under a high-pressure atmosphere of nitrogen or ammonia, the crystal growth speed can be further increased.

Although embodiments of the liquid-phase growth and the vapor-phase growth have been described with respect to the epitaxial growth on a sapphire substrate, the invention also can be applied to epitaxial growth using another substrate or a nitride bulk crystal growth.

The yield and the grain size of the nitride microcrystal obtained by the synthesis can be controlled by residence time of the gas, such as ammonia, injected into the Group III melt. Modifications in which the shape of the end of a gas injection tube is changed and a path through which bubbles of gas escape is formed by quartz work or the like in the solution can be therefore considered.

(Other embodiments)

The nitride microcrystal obtained according to the invention can be widely applied as a semiconductor material or luminescence material. Especially, the liquid phase growth method according to the invention is effective when applied to fabrication of ultraviolet—yellow light emission devices.

For example, when material housing parts are provided in two positions in the liquid phase growth apparatus described in the second embodiment and an Mg doped GaN material is charged in one of the parts, while an Si doped GaN material is charged in the other part, GaN films of the p-type and the n-type can be continuously grown on a substrate. When an LED fabricating process is applied to the epitaxial growth substrate obtained in this manner, a blue LED of a p-n junction type can be easily fabricated. According to this method, an LED can be manufactured easily and safely at low cost as compared with the conventional MOVPE. For GaN grown by the conventional MOVPE, it is necessary to additionally perform heat treatment in order to form a p-type crystal. Consequently, there is a limitation that the structure of an element has to be designed so that the surface of the crystal is always of the p-type. By using the liquid phase epitaxial growth method according to the invention, since the p-type conductivity can be obtained without performing heat treatment, tolerance in designing the element structure can be largely increased.

Since the nitride synthesis temperature, the atmosphere pressure, the dose of the material, and the like differ according to the kind of the nitride to be synthesized and the kind of a material to be used, it is difficult to unconditionally determine the optimum conditions.

(Embodiment 8)

Figure 9:
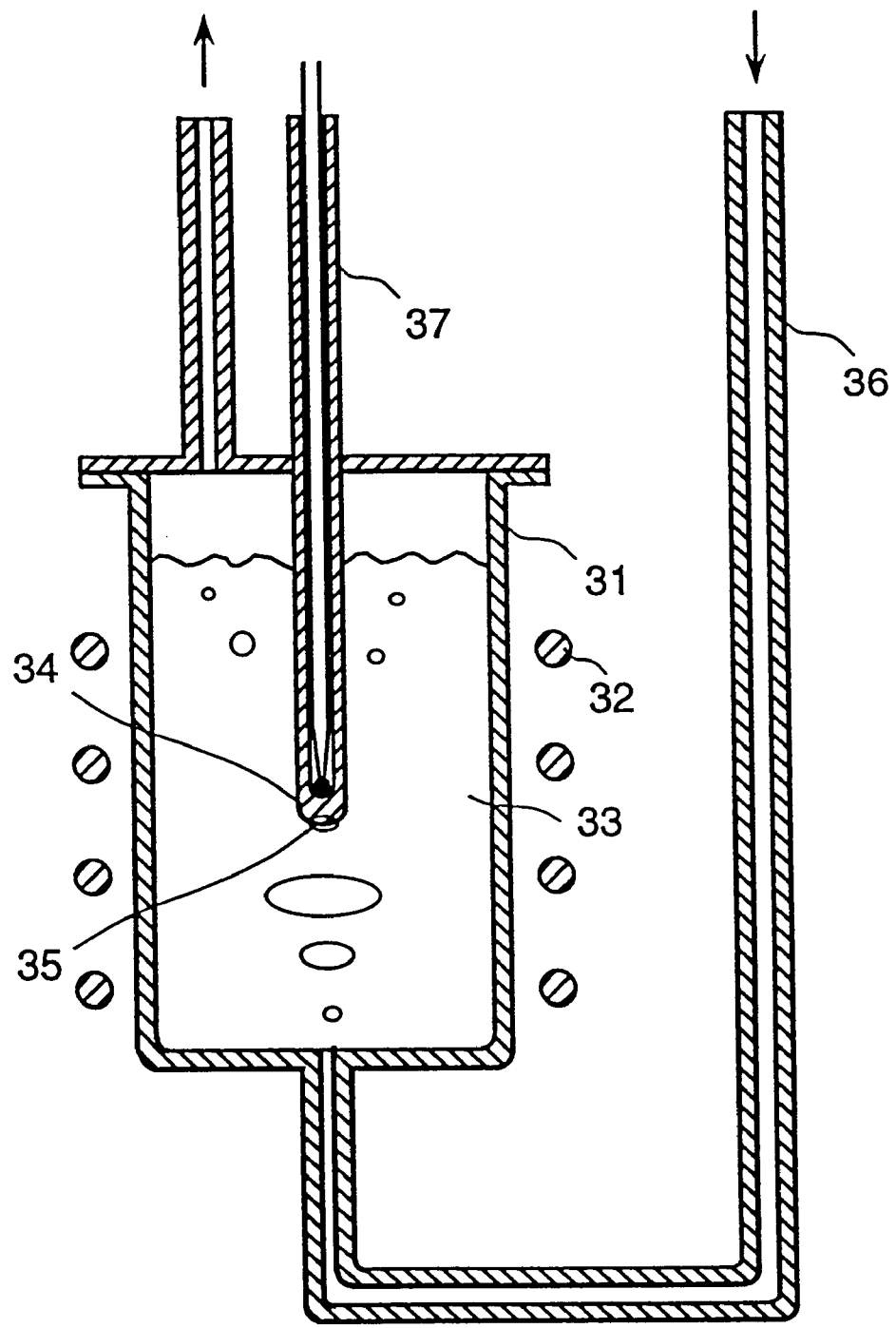
FIG. 9 is a schematic cross section of a GaN crystal growth system according to an eighth embodiment of the invention.

As an eighth embodiment of the invention, an apparatus as shown in FIG. 9 was manufactured. An example in which the GaN crystal was grown by using this apparatus will be described.

3000 g of a molten Ga 33 was charged into a quartz vessel 31 having a inner diameter of 70 mm and a height of 200 mm and a piece of an SiC single crystal of (6 mm×6 mm) was attached as a seed crystal 35 to the end of a seed crystal supporting jig 34 and was fixed in the molten Ga 33. In such a state, the molten Ga 33 was heated by heaters 32 and was controlled to 1000° C. by an output of a thermocouple 37.

Subsequently, ammonia gas was introduced from the bottom of the quartz vessel 31 via an ammonia introduction tube 36 made of quartz having an inner diameter of 6 mm at a rate of 0.2 l/min for 76 hours. The ammonia gas introduced in the molten Ga 33 rose as bubbles in the melt. The number of bubbles per minute was about 350. The bubbles of the ammonia gas rising in the melt collided with the surface of the seed crystal 35 and GaN crystals were sequentially formed on the seed crystal. The unreacted ammonia gas reached the surface of the molten Ga as bubbles and was exhausted to the outside of the vessel. The exhausted gas was treated by a wet scrubber and was released to the atmosphere. The bubbles of the ammonia gas reacted with Ga in places other than the surface of the seed crystal, thereby forming GaN microcrystals having a diameter of about a few Em which floated to the surface of the molten Ga and did not contribute to the growth on the seed crystal.

The grown crystals were cooled and taken out from the molten Ga. The metal Ga which adhered on the surface was cleaned by hydrochloric acid. As a result, a GaN crystal of a hexagonal column shape having a diameter of about 10 mm and the height of about 6 mm was derived. The obtained crystal was transparent yellowish brown. It was confirmed by X-ray diffractometry that the obtained crystal was a GaN crystal. The full width at half maximum (FWHM) of an X-ray diffraction peak is about 2 min. It can be said that the obtained crystal has a preferable crystallinity.

Figure 10:
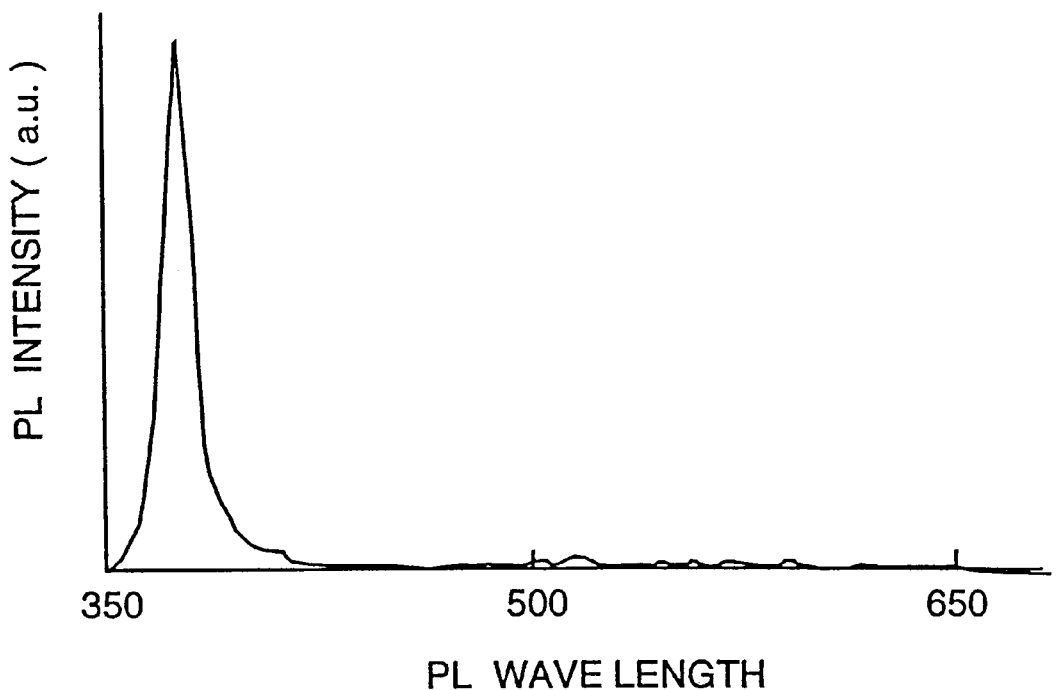
FIG. 10 is a diagram showing a photoluminescence measurement result at a room temperature of the GaN crystal fabricated in the eighth embodiment of the invention.

FIG. 10 shows the photoluminescence measurement result of the obtained crystal at room temperature. A sharp light emission peak corresponding to a band edge emission of undoped GaN was observed at 360 nm. It was also confirmed by the photo luminescence measurement that the obtained crystal is a high-quality GaN crystal.

(Embodiment 9)

Figure 11:
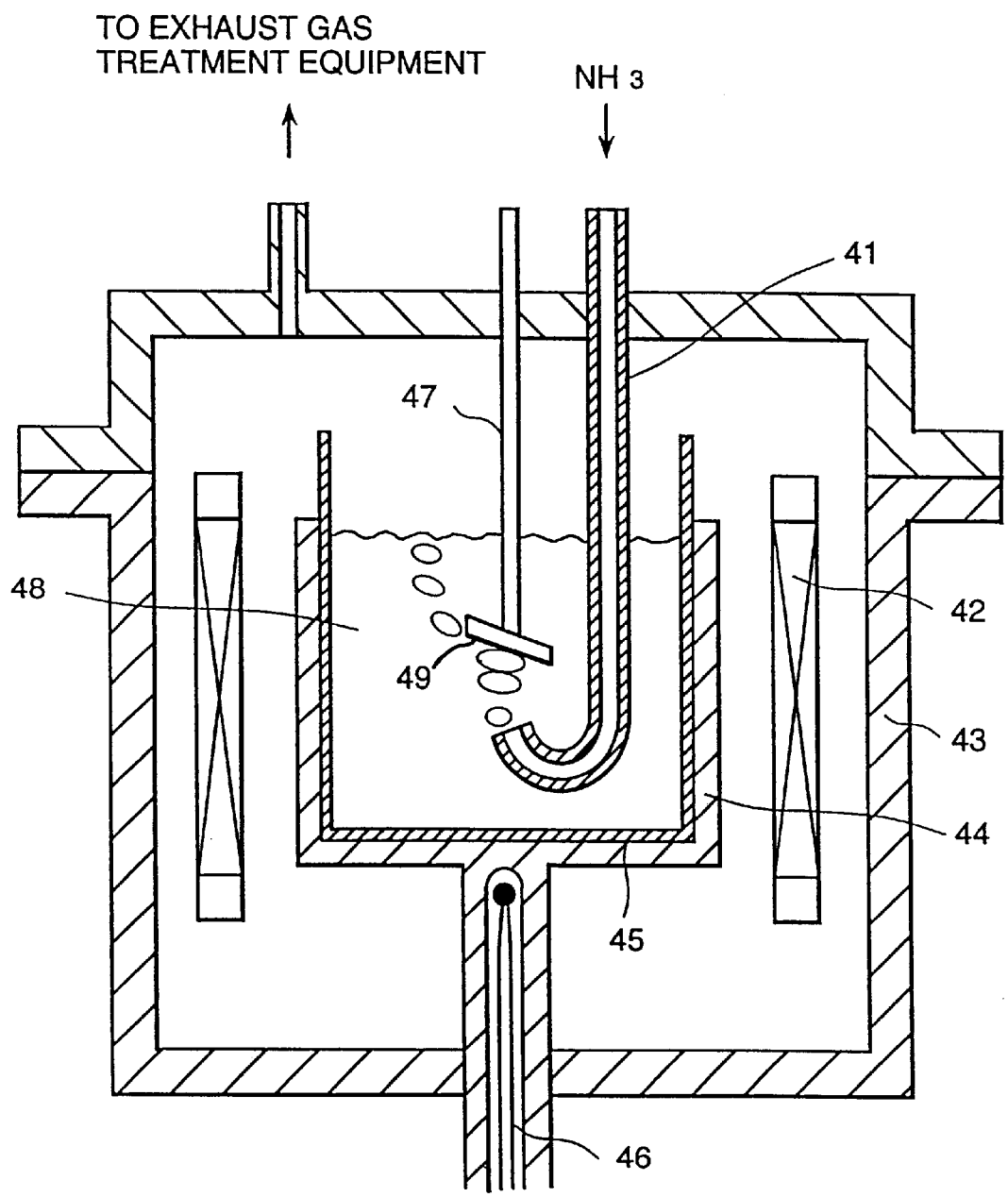
FIG. 11 is a schematic cross section of a GaN crystal epitaxial growth system according to a ninth embodiment of the invention.

As a ninth embodiment of the invention, an apparatus as shown in FIG. 11 was manufactured. An example in which the GaN crystal was epitaxially grown by using the apparatus will be described.

A quartz crucible 45 having an inner diameter of 70 mm and a height of 150 mm was housed in a graphite susceptor 44 and was installed in a stainless vessel 43. 3000 g of molten Ga 48 was charged into the quartz crucible 45 and a c-face sapphire single crystal substrate (hereinbelow, called a sapphire substrate) of (25 mm×25 mm) was attached to the end of a substrate supporting jig 47 and was immersed in the molten Ga 48. The sapphire substrate 49 was fixed so as to be inclined from the horizontal by a few degrees in the molten Ga 48. An ammonia gas introduction tube 41 made of quartz and having an end bent in a J-letter shape was installed in the molten Ga 48. The end of the gas introduction tube 41 was fixed so as to be positioned just below the lower end of the sapphire substrate 49. In such a state, the molten Ga 48 was heated by heaters 42 and was controlled to be 950° C. by an output of a thermocouple 46. Subsequently, ammonia gas was introduced via the ammonia introduction tube 41 at a rate of 0.1 l/min into the molten Ga 48 for one hour. The introduced ammonia gas rose as bubbles in the melt. The number of bubbles per minute was about 200. The bubbles of the ammonia gas which rose in the solution collided with the lower end of the sapphire substrate 49 and rose along the surface of the substrate. After that, the bubbles reached the surface of the molten Ga 48 and were exhausted to the outside of the vessel. The exhausted gas was treated by a wet scrubber and was released to the atmosphere.

The grown crystal was cooled and was taken out from the molten Ga 48 and the metal Ga which adhered to the surface was cleaned by hydrochloric acid. As a result, a transparent crystal thin film having a thickness of about 4 μm was obtained on the sapphire substrate. The obtained crystal was confirmed to be a GaN crystal by X-ray diffractometry. The full width at half maximum (FWHM) of the X-ray diffraction peak was about 5 min.

Figure 12:
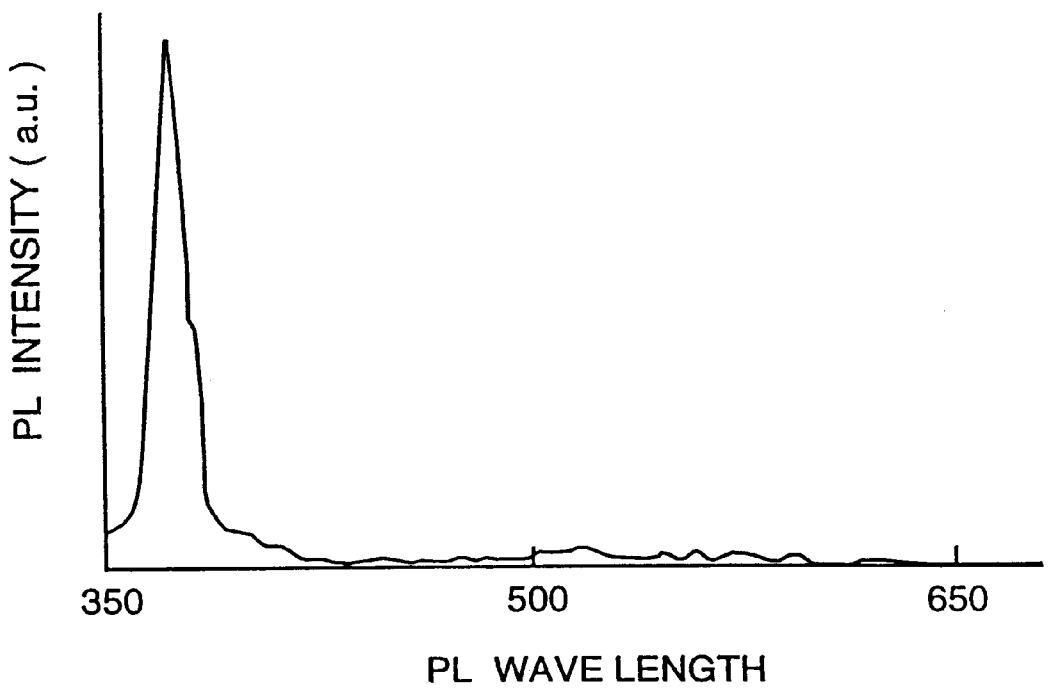
FIG. 12 is a diagram showing a photoluminescence measurement result at a room temperature of a GaN epitaxial growth crystal fabricated in the ninth embodiment of the invention.

FIG. 12 shows a photoluminescence measurement result of the obtained crystal at room temperature. A sharp light emission peak corresponding to a band edge emission of undoped GaN was observed at 360 nm and it was confirmed that the obtained crystal was a high-quality GaN crystal.

Since the nitride crystal growth temperature, the atmosphere pressure during growth, the dose of the material, and the like are different according to the kind of the nitride to be grown and the kind of a material to be used, they cannot be unconditionally determined.

The reason why ammonia is chosen as a gas containing nitrogen is because it is preferred when chemical activeness to some extent, safety and economical efficiency are considered. Theoretically, hydrazine gas, mono methyl hydrazine, and the like also can be used. Those gases have a much larger danger of explosion than that of ammonia.

The temperature of the Group III material during the crystal growth is set to be lower than the melting point of the nitride to be grown in order to prevent decomposition or re-melt of the grown crystal.

Modification)

Although GaN crystal growth has been described in the foregoing embodiment, the invention can be also applied to crystal growth of InN, AlN, or AlGaN or GaInN as a mixed crystal of InN and AlN. Further, by doping an impurity element in the Group III melt or the gas including nitrogen, a nitride crystal in which an impurity is doped can be also grown.

As a gas including nitrogen, other than ammonia, it is possible to use hydrazine, mono methyl hydrazine, or the like.

The shape of the end of the tube for introducing a gas such as ammonia into the Group III solution can be variously modified in order to control the size and the number of bubbles of the gas in the solution. For example, a plurality of nozzles for producing bubbles can be formed at the end of the gas introduction tube or a net can be provided at the end of the gas introduction tube.

A modification in which a plurality of seed crystals or substrate crystals are provided in the Group III solution also can be considered.

Although only a crystal growth vessel showing a part of the invention has been described in the embodiments shown in FIGS. 1, 2, 8, 9, and 11, if a system is provided in which a mass flow controller for regulating the flow of the gas and a temperature controller which can automatically control the temperature of a heater by a program are combined, the crystal growth can be more easily controlled.

The nitride crystal obtained by the invention can be widely applied as a semiconductor material or a luminescent material Especially, a bulk single crystal substrate of a nitride is optimum as a substrate material when a blue laser diode is produced.

(Embodiment 8)

Figure 13:
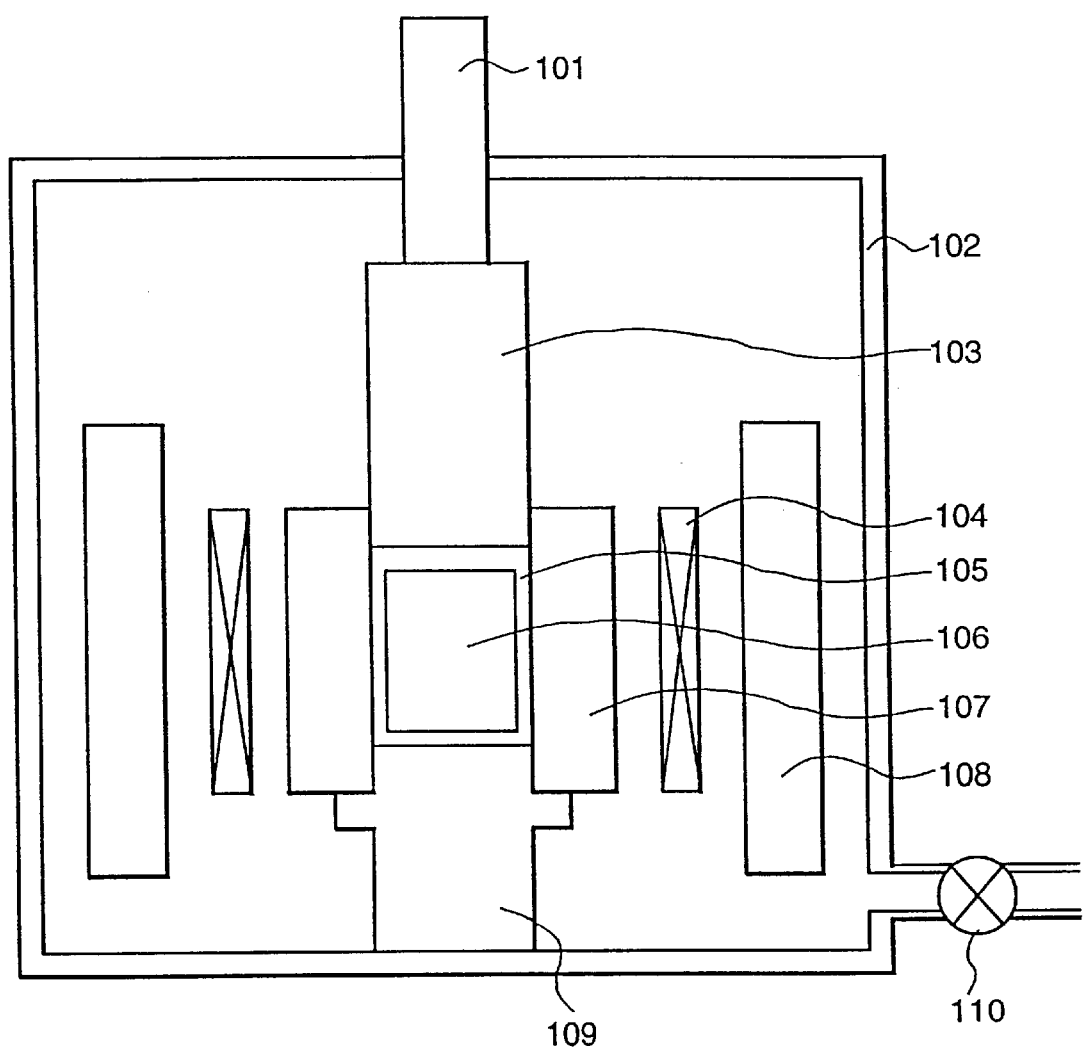
FIG. 13 is a cross section showing a crystal growth system used for another embodiment of the invention.

As another embodiment of the invention, an example of growing a GaN crystal by using an apparatus having a construction as shown in FIG. 13 will be described. In the embodiment, a liquid encapsulating agent is used.

The apparatus is assembled in a water-cooled chamber 102 made of stainless steel. A stand 109 is arranged on the bottom face of the water-cooled chamber 102 and a cylinder 107 is put on the stand 109. A heater 104 and a heat insulating material 108 are arranged around the cylinder 107. A piston 103 is slidably fit into the upper end of the cylinder 107. The piston 103 is vertically moved by a push rod 101 connected to a hydraulic cylinder (not shown), thereby enabling a material 106 arranged in the cylinder 107 to be pressurized. The cylinder 107, the piston 103, the stand 109, the heater 104, and the insulating material 108 are made of a high impurity graphite The cylinder 107 has an inner diameter of 10 mm and a height of 60 mm. 10 g of GaN crystal powders as a material 106 produced by the injection method and 2 g of $B_2O_3$ as a liquid encapsulating agent 105 were charged into the cylinder 107. Each of the GaN crystal powders and $B_2O_3$ was sufficiently ground in a mortar to reduce the grain size. When the GaN crystal powders and $B_2O_3$ were charged into the cylinder 107, the material was arranged so that the $B_2O_3$ surrounded the GaN crystal powders. Since the volume of the powder material 106 increased, it was difficult to charge all of the amount into the cylinder 107. The material was, therefore, dividedly charged a few times while compressing the material 106 by using the piston 103 during the charging of the material.

The pressure in the chamber 102 of the apparatus to which the material 106 was charged was reduced to $1 \times 10^{-2}$ torr via a valve 110 for atmosphere gas substitution and the powders of the material 106 were degassed. In such a state, a pressure of 4 ton/cm$^2$ was applied to the material by using the piston 103 and the material was heated to 2200° C. by using the heater 104. After the pressurization and heating were performed on the material 106 for three hours, the heater temperature was lowered at a ratio of 2° C./min to 600° C., the pressurization by the piston 103 was stopped, the temperature was further cooled to a room temperature, and the sample was taken out.

A GaN single crystal having a large grain size, which seems to have been obtained in such a manner that the molten GaN was slowly solidified, was formed in the cylinder 107 that was taken out, a GaN polycrystal layer containing the metal Ga was formed around the GaN single crystal and a thin $B_2O_3$ film covered the whole surface. The GaN single grain was in a hexagon column shape having a diameter of 7 mm and a height of 16 mm.

(Embodiment 11)

As another embodiment of the invention, the following GaN crystal was grown by using the same apparatus as that of the eighth embodiment. The embodiment also uses a liquid encapsulating agent.

The apparatus was prepared in which molten $B_2O_3$ was thinly applied to the inner wall of the cylinder 107 and end faces of the piston 103 and the stand 109. 10 g of the GaN powders produced by the injection method and 0.5 g of the metal Ga were heated to 30° C. and mixed well in a state where Ga was fused. The mixture was compressed by a press to be preformed in a disk shape having a diameter of 9 mm and a height of 22 mm. The preformed material 106 was set in the cylinder 107 and was heated to 650° C. in a nitrogen atmosphere to soften $B_2O_3$ as a liquid encapsulating agent 105. In such a state, a pressure of 4 ton/cm$^2$ was applied to the material 106 by using the piston 103. Further, the material was heated to 2200° C. in this state and was left for three hours. After that, the material was cooled in a manner similar to the eighth embodiment, thereby obtaining a GaN single crystal having a similar grain size as that of the eighth embodiment.

(Embodiment 12)

As another embodiment of the invention, the following GaN crystal was grown by using the same apparatus as that of the eighth embodiment. The embodiment also uses a liquid encapsulating agent.

10 g of GaN crystal powders as a material 106 produced by the injection method and 2 g of $B_2O_3$ as a liquid encapsulating agent 105 were charged into the cylinder 107. When the GaN crystal powders and $B_2O_3$ were charged into the cylinder 107, this material was arranged so that the $B_2O_3$ surrounded the GaN crystal powders.

The pressure in the chamber 102 of the apparatus to which the material 106 was charged was reduced to $1 \times 10^{-2}$ torr via the valve 110 for atmosphere gas substitution and the powders of the material 106 were degassed. In such a state, the pressure of 100 ton/cm$^2$ was applied to the material by using the piston 103 and the material was heated to 1900° C. by using the heater 104. After the material was left for 48 hours while pressurization and heating were performed on the material, the heater temperature was lowered at a ratio of 20° C./min to 600° C., the pressurization by the piston 103 was stopped, the temperature was further cooled to room temperature, and the sample was taken out.

There were some GaN single crystals each having a large grain size, which seem to have been obtained in such a manner that the GaN crystal grains were grown in solid phase. There was a polycrystal layer of GaN having a relatively small grain size around the GaN single crystals. Further, the whole outer face was covered by a thin $B_2O_3$ film. The shapes of the GaN single crystals were various. The largest crystal had a diameter of 6 mm and a height of about 10 mm.

(Embodiment 13)

As another embodiment of the invention, the following GaN crystal was grown by using the same apparatus as that of the eighth embodiment. The embodiment also uses a liquid encapsulating agent.

10 g of GaN crystal powders as a material 106 produced by the injection method and 2 g of $B_2O_3$ as the liquid encapsulating agent 105 were charged in the cylinder 107. When the GaN powders were charged to the cylinder 107, the material was arranged so that the $B_2O_3$ surrounded the GaN powders.

The pressure in the water-cooling chamber 102 of the apparatus to which the material 106 was charged was reduced to $1' 10^{-2}$ torr via the valve 110 for atmosphere gas substitution and the powders of the material 106 were degassed. In such a state, a pressure of 10 ton/cm$^2$ was applied to the material by using the piston 103 and the material was heated to 2200° C. by using the heater 104. After the material was pressurized and heated for three hours, the heater temperature was decreased to 2000° C. and the material was left for 30 minutes. Further, the pressurization load was reduced to 9.5 ton/cm$^2$, the heater temperature was increased to 2100° C., and the material was left for 30 minutes. After that, the heater temperature was decreased to 2000° C. and the pressurization load was increased to 10 ton/cm$^2$. The above cycle was repeated five times, the heater temperature was decreased finally to 600° C. at a ratio of 2° C./min, the pressurization by the piston was stopped, the temperature was further cooled to room temperature, and the sample was taken out.

A GaN single crystal having a large grain size, which seems to have been obtained by slowly solidifying the molten GaN, was formed in the cylinder 107 that was taken out, a small amount of GaN polycrystal layer containing the metal Ga was formed around the GaN single crystal and the whole surface was covered by a thin $B_2O_3$ film. The GaN single grain was in a hexagon column shape having a diameter of 8 mm and a height of 18 mm.

(Embodiment 14)

Figure 14:
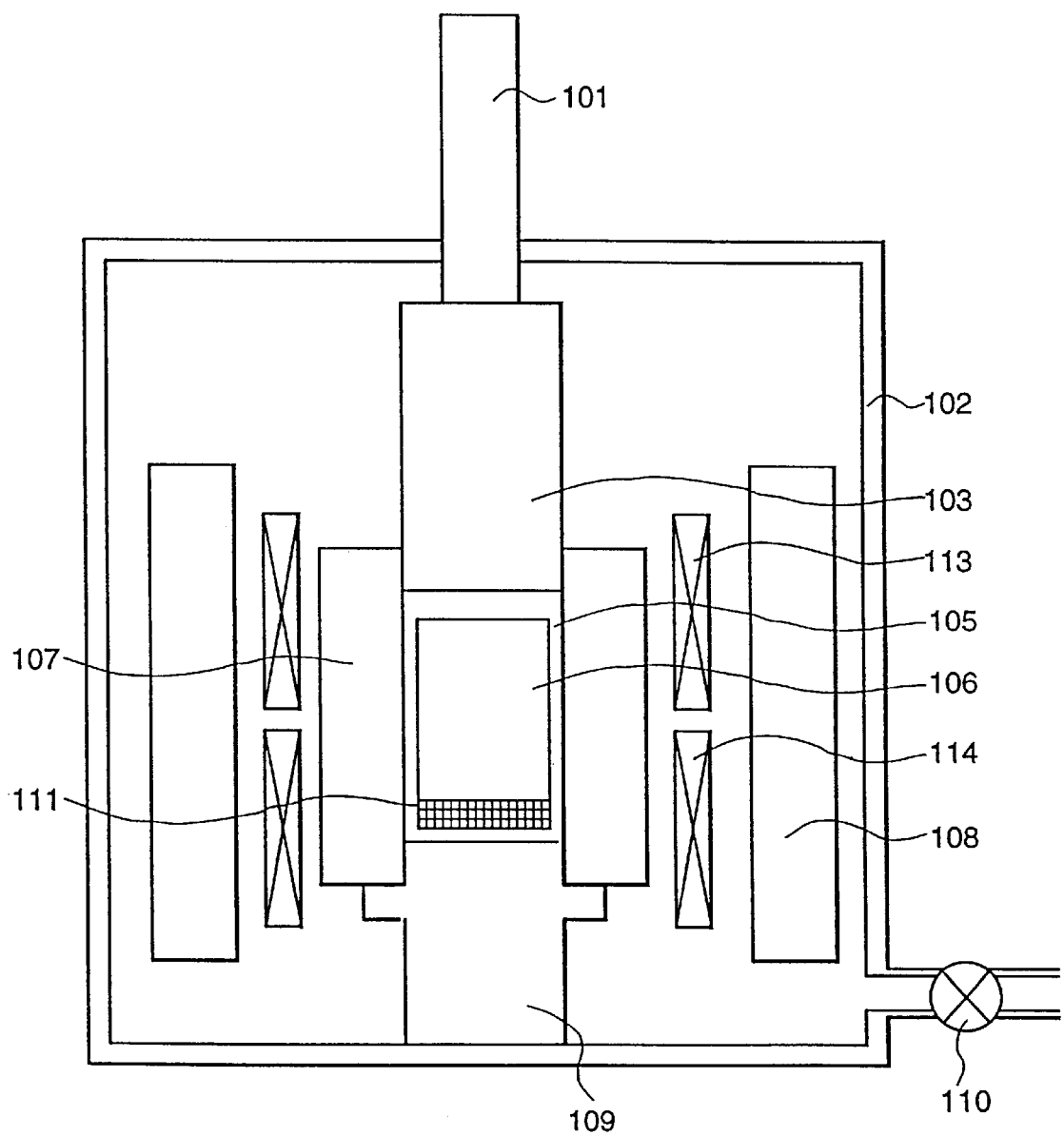
FIG. 14 is a cross section showing a crystal growth system used for another embodiment of the invention.

As another embodiment of the invention, the following GaN crystal was grown by using an apparatus having the construction as shown in FIG. 14. The embodiment also uses a liquid encapsulating agent.

The apparatus has substantially the same construction as that of the apparatus shown in FIG. 13, but is different in that the heater for heating the material is divided into an upper heater 113 and a lower heater 114, so that the material 106 has a temperature gradient in the vertical direction of the diagram. The stand 109 has a water-cooled construction so that the material can easily have a temperature gradient.

A GaN single crystal produced by a method similar to that of the foregoing embodiment was shaped and arranged as a seed crystal 111 on the bottom part of the cylinder 107 made of high-impurity graphite. On the seed crystal, 10 g of GaN crystal powders produced by the injection method were put as a material 106. The $B_2O_3$, serving as a liquid encapsulating agent 105 was arranged so as to surround the GaN seed crystal and the powder material.

The pressure in the chamber 102 of the apparatus to which the material 106 was charged was reduced to 1' $10^{-2}$ torr via the valve 110 for atmosphere gas substitution and the powders of the material 106 were degassed. In such a state, a pressure of 10 ton/cm$^2$ was applied to the material by using the piston 103, the upper part of the material was heated to 2200° C. by using the heater 114, and the lower part of the material was heated to 2000° C. by using the heater 113. After the material was left in such a state for three hours until the material powders were completely dissolved, the temperatures of the upper and lower heaters were decreased to 1800° C. and 1600° C. at a ratio of 0.5° C./min and then decreased to 800° C. and 600° C. at a ratio of 10° C./min, respectively. The pressurization by the piston was stopped, the material was further cooled to room temperature, and the sample was taken out.

A GaN single crystal having a large grain size, which seems to have been obtained by slowly solidifying the dissolved GaN, was formed in the cylinder 107 that was taken out, a small amount of GaN polycrystal layer containing the metal Ga was formed around the GaN single crystal and the whole surface was covered by a thin $B_2O_3$ film. The GaN single grain was in a column shape having a diameter of 10 mm and a height of 20 mm.

In each of the embodiments 8 to 12, except for $B_2O_3$, KCl, and NaCl, $BaCl_2$, $CaCl_2$, or the like can be also used as a liquid encapsulating material.

Although the load application direction was vertical in the foregoing embodiments, a modification in which the load is applied in the horizontal direction is also possible. Modifications in which resistance heating is changed to an induction heating or the like as heating means or in which a plurality of heating means are used to minutely set a temperature distribution and a temperature control at the time of crystal growth and the like also can be considered. The direction of the temperature gradient can be in the opposite direction or in the horizontal direction. The direction of the temperature gradient and the load application direction need not always be coincident.

(Embodiment 15)

Figure 15:
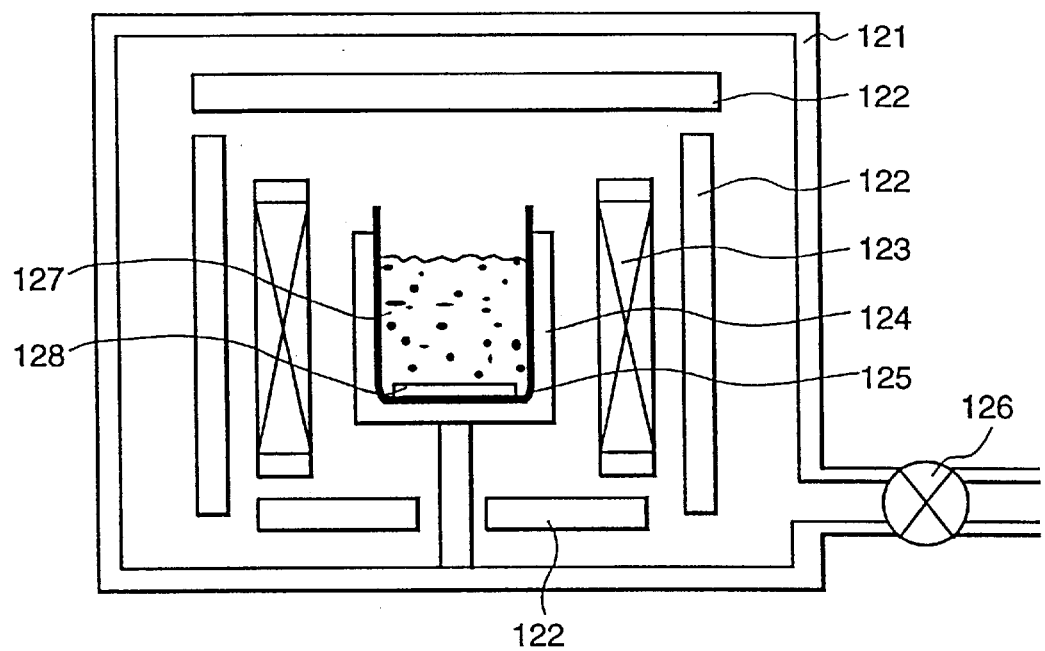
FIG. 15 is a cross section showing a GaN crystal growth system used for further another embodiment of the invention.

As another embodiment of the invention, an example of growing the GaN crystal by using a system having the construction as shown in FIG. 15 will be described. The embodiment uses a flux.

In the system, a heat insulating material 122, a heater 123, and a susceptor 124 which are made of a high-impurity graphite are housed in a water-cooled high-pressure chamber 121 made of stainless steel.

On the bottom of a cylindrical pBN crucible 125 having an inner diameter of 50 mm and a height of 150 mm, a sapphire substrate, on which GaN has been preliminarily epitaxial grown by MOCVD, was arranged as a seed crystal 128. The sapphire substrate was fixed to the bottom of the crucible so as not to be floated when a flux is charged.

15 g of GaN powders synthesized by the injection method as a material 127 and 100 g of a metal Ga as a flux were charged into the crucible. The GaN powders and the metal Ga were heated to 50° C. and mixed well in a state where metal Ga melts so that the metal Ga covers the surface of each of the GaN powders.

The pressure in the furnace was increased to 20 MPa with a nitrogen gas by operating a valve 126. While maintaining the pressure, the material 127 was increased to 1600° C. The material 127 was held at 1600° C. for three hours, the GaN powders were dissolved in the Ga flux, the material temperature was decreased to 800° C. at a ratio of 1° C./min, and after that, the material was quenched, and the pressure was returned to atmospheric pressure.

When the sapphire substrate serving as the seed crystal 128, which was subjected to the above growth processes, was taken out from the furnace and the adhered Ga was cleaned by hydrochloric acid, a GaN single crystal having a thickness of about 1.3 mm was grown on the sapphire substrate.

(Embodiment 16)

Figure 16:
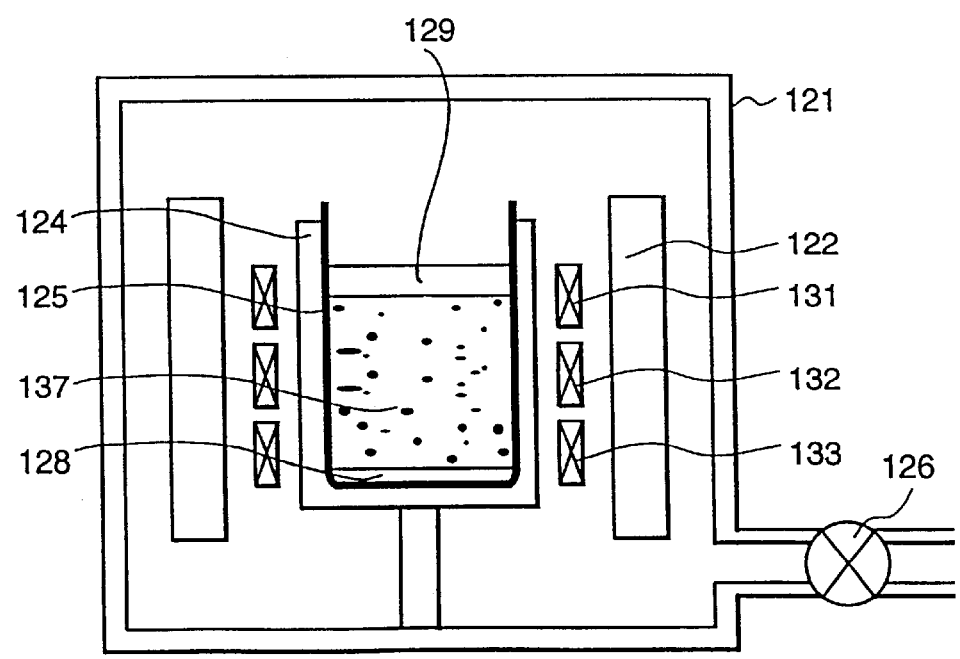
FIG. 16 is a cross section showing a GaN crystal growth system used for further another embodiment of the invention.

As another embodiment of the invention, an example of growing a GaN crystal by using a system having the construction as shown in FIG. 16 will be described. This embodiment also uses a flux.

The construction of the system is substantially the same as that of the system described in the thirteenth embodiment, but is different in that three heaters, including an upper heater 131, a middle heater 132 and a lower heater 133, are used instead of one heater. The heaters independently control temperatures, so that the material 127 can have a temperature gradient in the vertical direction.

A GaN single crystal produced by the method of the thirteenth embodiment was placed as a seed crystal 128 on the bottom of the crucible 125. The seed crystal 128 was fixed to the bottom of the crucible 125 so as not to be floated when a flux is charged. 50 g of GaN powders as a material 137 and 100 g of Ga and 20 g of Bi as a flux were charged into the crucible 125. The GaN powders obtained by heating the metal Ga to 900° C. in an ammonia gas flow, reacting Ga with N, and removing unreacted Ga by aqua regia were used.

The GaN powders and the flux were heated to 250° C. in an Ar gas atmosphere and were mixed well in a state where the flux melted, so that the surface of each of the GaN powders was covered by the flux.

Subsequently, 15 g of $B_2O_3$ as a liquid encapsulating agent 129 was put on the material 127 obtained by mixing the GaN powders and the flux. The crucible 125 in which the seed crystal 128, the material 127, and the liquid encapsulating agent 129 were charged in the above manner was set in the furnace for growth. The valve 126 was operated to provide an Ar gas atmosphere. The material was first heated to 700° C. to melt the $B_2O_3$, the furnace atmosphere was then evacuated and the evacuated state was held for a predetermined time. This work was done to take out bubbles included in the flux when the GaN powders and the flux were mixed. More bubbles did not come out from the $B_2O_3$ after about 45 minutes had elapsed, so that the pressure in the furnace was increased to 20 MPa with the Ar gas. While maintaining the pressure, heating of the material 127 was started.

It was controlled so that the temperature of the upper heater 131 was 1600° C., the temperature of the middle heater 132 was 1400° C., and the temperature of the lower heater 133 was 1200° C., and the furnace was left in such a state for 96 hours.

In the main growth, GaN which melted in the high temperature part was diffused and supersaturated in the lower temperature part, and GaN was deposited on the seed crystal arranged in the lowest temperature part. The reason why the growth time is longer than that of the embodiment 13 is because it takes time to diffuse the solute in the flux. The charged GaN powders did not melt in the flux in a lump. Although unsolved GaN powders existed in the flux during the growth, since the GaN powders have a density lower than that of the flux, the GaN powders were floated in the upper part of the flux and did not exert an adverse influence on the crystal growth on the seed crystal.

After such a state was maintained for 96 hours, each of the heater temperatures was reduced at a ratio of 5° C./min for three hours, and then the material was quenched. The pressure was returned to atmospheric pressure.

When the seed crystal 128 subjected to the above growth processes was taken out from the furnace and the adhered flux was cleaned by aqua regia, it was found that a GaN single crystal having a thickness of about 4 mm had grown on the seed crystal.

(Embodiment 17)

Figure 17:
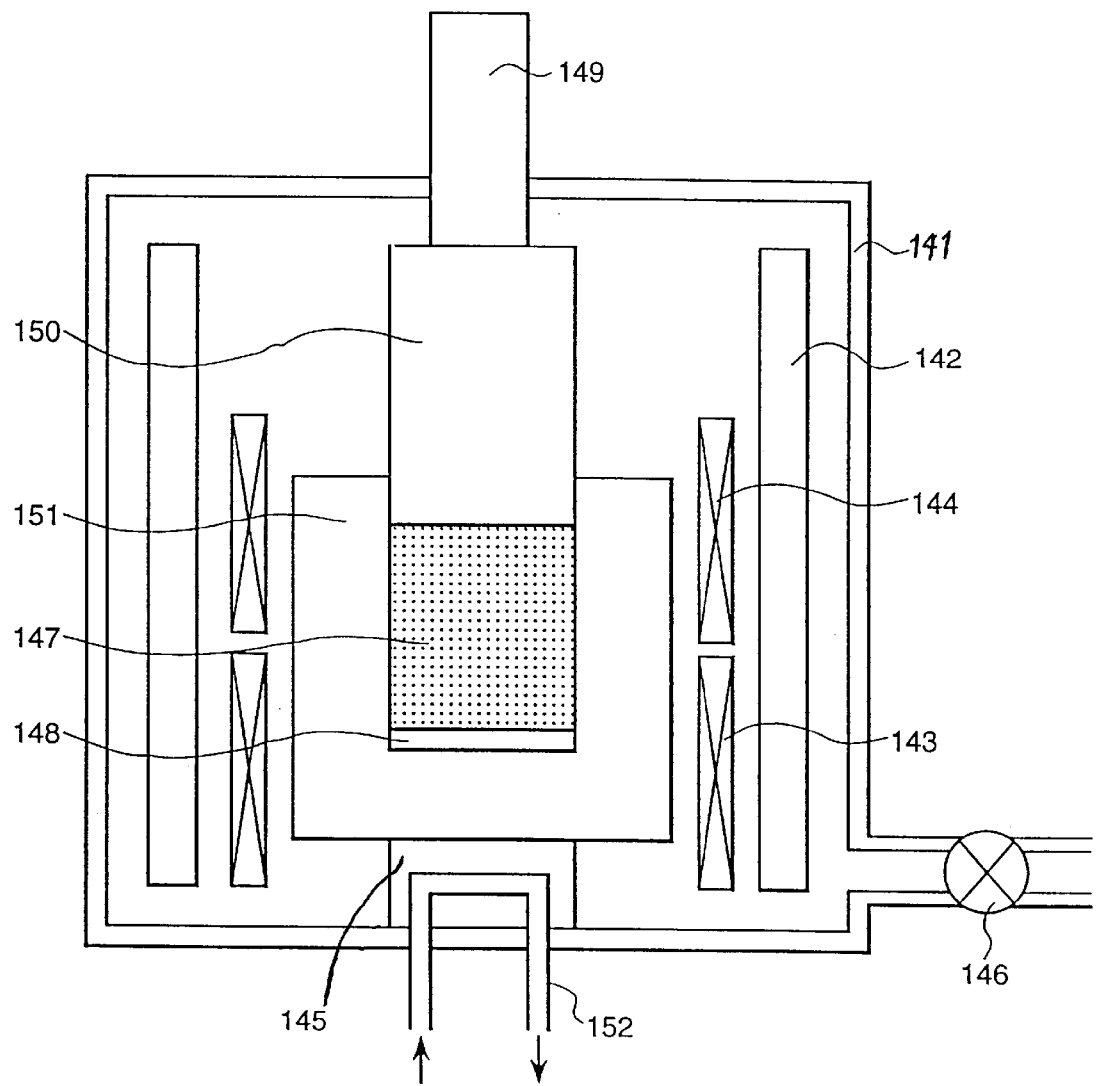
FIG. 17 is a cross section showing a GaN crystal growth system used for further another embodiment of the invention.

As another embodiment of the invention, an example of growing a GaN crystal by using a system having the construction as shown in FIG. 17 will be described. This embodiment also uses a flux.

The system was assembled in a water-cooled chamber 141 made of stainless steel. A stand 145 was installed on the bottom face of the water-cooled chamber 141 and a cylinder 151 was arranged on the stand 145. An upper heater 144, a lower heater 143, and an insulating material 142 were installed around the cylinder 151. A piston 150 was slidably fit into the upper end of the cylinder 151. The piston 150 is capable of being moved vertically by a push rod 149 connected to a hydraulic cylinder (not shown) so as to pressurize a material 147 arranged in the cylinder 151. The cylinder 111, the piston 110, the upper heater 131, the lower heater 133, and the insulating material 102 are made in a high impurity graphite. The stand 145 on which the cylinder 111 is put is water-cooled by a water-cooling pipe 152, thereby enabling the set temperature in each of the heaters 143 and 144 to be changed and a temperature gradient in the vertical direction of the material 147 to be set.

A GaN single crystal having a diameter of 10 mm and a thickness of 0.5 mm was placed as a seed crystal 148 on the bottom of the cylinder 151 having an inner diameter of 10 mm and a height of 60 mm. 15 g of a mixture of the GaN powders synthesized by the injection method and a metal Ga and 10 g of a metal Ga as a flux were charged in the cylinder 151. Since the mixture of the GaN powders synthesized by the injection method and the metal Ga can be obtained as a mixture from the beginning, it saves the trouble of mixing the GaN powders with Ga. It is difficult to accurately obtain the amount of the GaN powders included in the mixture. The amount of the GaN powders included in the mixture charged at this time was estimated from the result of an analysis of a sampled mixture as about 5 g.

The pressure in the water-cooled chamber 141 in which the material was charged was reduced to 1' $10^{-2}$ torr via a valve 146 for atmospheric gas substitution and the bubbles of gas mixed in the material 147 were taken out. In such a state, a pressure of 10 ton/cm$^2$ was applied to the material by using the piston 150, the upper heater 144 was heated to 2200° C. and the lower heater 143 was heated to 1800° C. It was calculated that the temperature in the upper part of the material 147 was about 2100° C. and the temperature in the lower part was 1900° C. After the material 147 was pressurized and heated for three hours, the upper heater temperature was decreased to 800° C. and the lower heater temperature was decreased to 600° C. at a ratio of 2° C./min, the pressurization by the piston 150 was stopped, the temperature was decreased to room temperature, and the sample was taken out.

In the cylinder which was taken out, there was a GaN single crystal having a large grain size, which seemed to have been obtained in such a manner that the molten GaN slowly solidified and a metal Ga layer containing a small amount of the GaN powders surrounded the crystal. The GaN single crystal grain had a column shape in which the central part is bulged. The diameter was 10 mm and the maximum height was 11 mm.

The crystal growing method of the embodiment also can be applied for growth of not only GaN, but also a nitride crystal except for GaN, for example, AlN or InN or a mixed crystal of them. In this case, although the kind of flux which can be used and the growth temperature may be different, they are substantially the same as those in the case of GaN.

As a liquid encapsulating agent 129, except for $B_2O_3$, NaCl, KCl, $BaCl_2$, $CaCl_2$ or the like can be used.

The heaters 131, 132, 133, 143, and 144 as heating means for the material 147 may be of a resistance heating type, an induction heating type, a radiation heating type, or the like.

According to the invention as mentioned above, excellent effects as shown below can be obtained.

(1) According to the fabricating method described, the gas containing nitrogen is injected into the Group III melt at a temperature much lower than the melting point of a nitride to be synthesized, the liquid-phase Group III element and the vapor-phase Group V element are reacted with each other, and a solid-phase Group III nitride crystal is directly formed in the Group III element melt. Therefore, a large amount of crystals can be fabricated easier and cheaper by a simple system in a shorter time as compared with a case where a nitride melt is made.

(2) With respect to the mixture of the Group III nitride microcrystal and the Group III metal material according to the invention, since the nitride microcrystal is synthesized in the Group III melt, the surface of the nitride microcrystal is completely covered with the Group III metal material. When the mixture is used as a liquid phase growth material, the mixture is very easily dissolved and the saturated solution can be easily obtained as compared with a conventional material Consequently, the controllability and reproducibility of the epitaxial growth are largely improved.

(3) According to the growth methods of the invention, a large quantity of the high-impurity Group III nitride semiconductor crystals can be produced easily and cheaply in a short time. The method is safe since a gas, such as hydrochloric acid, which is conventionally used in HVPE, or a dangerous material, such as an organic metal of the type used in MOVPE, are unnecessary. According to the growth method of the invention, a liquid phase growth or a vapor phase growth of a nitride crystal, which are conventionally especially difficult, can be easily performed As a result, a device having a p-type crystal of a high carrier concentration can be easily produced without performing any special process on a nitride crystal. Since it is unnecessary to arrange the p-type conductive layer on the surface of a device, the degree of freedom in designing a device construction is higher.

(4) In the nitride growing method according to the invention, since an oxide or chloride which is conventionally used is not used as a material, an unreacted substance does not become an impurity when a liquid phase is grown. Consequently, the mixture can be directly used as a material of the liquid phase growth without extracting only a group III nitride. Since the extraction process can be omitted, not only can the process be largely shortened, but also contamination of the material which tends to occur in the extracting process can be eliminated, so that a high-impurity liquid phase growth can be realized.

(5) Further, according to the fabricating method of the invention, a Group III nitride semiconductor crystal, especially, a bulk single crystal which cannot be conventionally grown can be grown. When the crystal is used as a substrate, it is not only effective in providing a higher efficiency and longer life for a blue LED, but also largely contributes to promote a practical use of a blue LD which has not heretofore been practically used. Such a Group III nitride semiconductor crystal can be easily and cheaply grown by a simple apparatus. In addition, it is unnecessary to use a gas, such as chlorine, which is conventionally used in HVPE, or a dangerous material, such as an organic metal of the type used in MOVPE, so that the method is safe.

According to the nitride crystal growing method of the present invention, a bulk crystal of a group III nitride compound (for example, GaN) which is conventionally almost impossible to produce can be produced by a simple method Since a hot press system which is available on the market and is widely used for forming ceramics or the like, or an LEC which is generally used for growing a semiconductor crystal, can be employed as an apparatus of the invention, a special apparatus is unnecessary and the apparatus used for the invention is not so dangerous.

It is economical since only a small amount of the liquid encapsulating agent or the flux is necessary except for the material. Especially, in the method of which uses a flux, since the flux can be repeatedly used, it is especially economical.

By using the nitride crystal obtained by the invention as a substrate crystal, not only high efficiency and a long life of a nitride LED can be achieved, but also an effect to promote practical use of a nitride LD which is not yet practically used can be expected.

What is claimed is:

1. A nitride crystal fabricating method comprising the steps of heating a Group III metal element so as to melt the Group III metal element, injecting a gas containing nitrogen atoms into the melt of the Group III metal element at a temperature lower than the melting point of a nitride to be obtained, and thereby producing a Group III nitride microcrystal in the melt of the Group III metal element, the microcrystal being produced such that, when produced, all surfaces of the microcrystal are fully covered with the melt of the Group III metal element.

2. The nitride crystal fabricating method according to claim 1, wherein at least an impurity element is mixed with the Group III metal element, thereby obtaining a Group III nitride microcrystal in which said impurity element is doped.

3. A mixture of a Group III nitride microcrystal, obtained by the nitride crystal fabricating method according to claim 1, and a Group III metal material.

4. A method of liquid phase growth of a Group III nitride crystal, wherein a mixture of a Group III nitride microcrystal, obtained by the nitride crystal fabricating method according to claim 1, and a Group III metal material are used as a starting material.

5. Group III nitride crystal powders obtained by removing a Group III metal material from a mixture obtained by the nitride crystal fabricating method according to claim 1.

6. A method of vapor phase growth of a Group III nitride crystal, wherein the Group III nitride crystal powders according to claim 5 are used as a starting material.

7. A method of fabricating a Group III nitride crystal, wherein the Group III nitride crystal powders according to claim 5 are dissolved and re-solidified or sintered.

8. A mixture of a Group III nitride microcrystal, obtained by the nitride crystal fabricating method according to claim 2, and a Group III metal material.

9. A method of liquid phase growth of a Group III nitride crystal, wherein a mixture of a Group III nitride microcrystal, obtained by the nitride crystal fabricating method according to claim 2, and a Group III metal material are used as a starting material.

10. Group III nitride crystal powders obtained by removing a Group III metal material from a mixture obtained by the nitride crystal fabricating method according to claim 2.

11. A method of vapor phase growth of a Group III nitride crystal, wherein the Group III nitride crystal powders according to claim 10 are used as a starting material.

12. A method of fabricating a Group III nitride crystal, wherein the Group III nitride crystal powders according to claim 10 are dissolved and re-solidified or sintered.

13. A nitride crystal fabricating method comprising the steps of: immersing a seed crystal in a Group III element melt which is heated at a temperature lower than the melting point of a nitride to be obtained; introducing a gas containing nitrogen into the Group III element melt so as to make bubbles of the gas containing nitrogen intermittently come into contact with the surface of said seed crystal in the Group III element melt; and thereby growing a nitride crystal of the Group III element on the surface of said seed crystal.

14. A nitride crystal fabricating method comprising the steps of immersing a substrate crystal in a Group III element melt which is heated at a temperature lower than the melting point of a nitride to be obtained and fused, introducing a gas containing nitrogen into the Group III element melt so as to make bubbles of the gas containing nitrogen intermittently come into contact with the surface of said substrate crystal in the Group III element melt, and thereby epitaxially growing a nitride single crystal of the Group III element on the surface of said substrate crystal.

15. The nitride crystal fabricating method according to claim 14, wherein the Group III element is selected from the group consisting of Al, Ga, and In, and the gas substance containing said nitrogen is ammonia gas.

16. The nitride crystal fabricating method according to claim 13, wherein the Group III element is selected from the group consisting of Al, Ga, and In, and the gas substance containing said nitrogen is ammonia gas.

17. The nitride crystal fabricating method according to claim 2, wherein the Group III element is selected from the group consisting of Al, Ga, and In, and the gas substance containing said nitrogen is ammonia gas.

18. The nitride crystal fabricating method according to claim 1, wherein the Group III element is selected from the group consisting of Al, Ga, and In, and the gas substance containing said nitrogen is ammonia gas.

19. A nitride crystal growth method comprising a step of charging nitride crystal powders and a liquid encapsulating material into a cylinder and heating the powders and material while pressurizing by a piston, wherein the powders and material are heated until lust before the nitride crystal powders melt and the nitride crystal is grown in a solid phase state.

20. The nitride crystal growth method according to claim 19, wherein a nitride melt is produced and after that, the pressure and the temperature are returned to a normal pressure and a room temperature, and the nitride melt is solidified.

21. The nitride crystal growth method according to claim 19, wherein said nitride crystal powders are preliminarily formed under pressure.

22. The nitride crystal growth method according to claim 20, wherein said nitride crystal powders are preliminarily formed under pressure.

23. The nitride crystal growth method according to claim 19, wherein said nitride crystal powders are preliminarily formed under pressure.

24. The nitride crystal growth method according to claim 23, wherein a component element of the nitride crystal is used as a binder when the nitride crystal powders are formed under pressure.

25. The nitride crystal growth method according to claim 23, wherein a starting material of said nitride is nitride crystal powders obtained by removing a Group III metal material from a mixture of Group III metal element and Group III nitride microcrystal, the mixture including a Group III nitride microcrystal formed by heating a Group III metal element so as to melt the Group III metal element and injecting a gas containing nitrogen into the melt of the Group III metal element at a temperature lower than the melting point of the nitride formed.

26. The nitride crystal growth method according to claim 19, wherein the powders and material are put in vacuum or a nitride atmosphere until at least the liquid encapsulating material melts.

27. The nitride crystal growth method according to claim 19, wherein the nitride powders and material, in the cylinder has a temperature gradient.

28. The nitride crystal growth method according to claim 27, wherein a seed crystal is arranged on a low temperature side of the nitride crystal powders.

29. The nitride crystal growth method according to claim 19, wherein the pressure increase and decrease and/or the temperature increase and decrease are repeated during crystal growth.

30. A nitride crystal growth method of growing a nitride crystal by heating a flux and nitride crystal powders under pressure, dissolving nitride powders into the flux, and cooling the mixture, wherein the heating temperature of the flux is 800° C. or higher.

31. The nitride crystal growth method according to claim 30, wherein said flux contains at least one of Ga, In, Pb, Sn, Bi, and Na.

32. The nitride crystal growth method according to claim 30, wherein the nitride crystal powders as a material are obtained by removing a Group III metal material from a mixture of Group III metal element and Group III nitride microcrystal, the mixture including a Group III nitride microcrystal formed by heating a Group III metal element so as to melt the Group III metal element and injecting a gas containing nitrogen into the melt of the Group III metal element at a temperature lower than the melting point of the nitride formed.

33. The nitride crystal growth method according to claim 30, wherein the flux and nitride crystal powders have a temperature gradient, and the flux is cooled, thereby depositing a nitride crystal on a low temperature side.

34. The nitride crystal growth method according to claim 33, wherein a seed crystal is arranged in the flux to allow the nitride crystal to be deposited on the seed crystal.

35. The nitride crystal growth method according to claim 30, wherein a liquid encapsulating agent is floated on the flux.

36. The nitride crystal growth method according to claim 30, wherein a cylinder and a piston, or a compression gas of nitrogen, is used to provide the pressure.

* * * * *